(12) United States Patent
Mirkin et al.

(10) Patent No.: US 8,753,813 B2
(45) Date of Patent: Jun. 17, 2014

(54) GENERATION OF COMBINATORIAL PATTERNS BY DELIBERATE TILTING OF A POLYMER-PEN ARRAY

(75) Inventors: Chad A. Mirkin, Wilmette, IL (US); Adam B. Braunschweig, New York, NY (US); Jinan Chai, Spartanburg, SC (US); Dan J. Eichelsdoerfer, Evanston, IL (US); Louise R. Giam, Palo Alto, CA (US); Xing Liao, Evanston, IL (US); Lu Shin Wong, Manchester (GB)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 13/513,618

(22) PCT Filed: Dec. 2, 2010

(86) PCT No.: PCT/US2010/058773
§ 371 (c)(1),
(2), (4) Date: Jun. 15, 2012

(87) PCT Pub. No.: WO2011/071753
PCT Pub. Date: Jun. 16, 2011

(65) Prior Publication Data
US 2013/0040856 A1    Feb. 14, 2013

Related U.S. Application Data

(60) Provisional application No. 61/267,382, filed on Dec. 7, 2009, provisional application No. 61/292,444, filed on Jan. 5, 2010, provisional application No. 61/375,684, filed on Aug. 20, 2010.

(51) Int. Cl.
*C12Q 1/68* (2006.01)
*C12M 1/00* (2006.01)
*C12M 1/34* (2006.01)
*C12M 3/00* (2006.01)
*B05D 3/00* (2006.01)

(52) U.S. Cl.
USPC ... 435/6.1; 435/283.1; 435/287.1; 435/287.2; 427/2.11

(58) Field of Classification Search
USPC .................. 435/6, 6.1, 283.1, 287.1, 287.2; 427/2.11
See application file for complete search history.

(56) References Cited

U.S. PATENT DOCUMENTS 5,472,881 A   12/1995   Beebe et al.
5,776,748 A    7/1998   Singhvi et al.
(Continued)

FOREIGN PATENT DOCUMENTS

JP    11-016856 A    1/1999
JP    11-064350 A    3/1999
(Continued)

OTHER PUBLICATIONS

Abbe et al., Beiträge zur Theorie des Mikroskops und der mikroskopischen Wahrnehmung, Arch. mikrosk. Anat. Entwichlungsmech., 9, 413-68 (1873).
(Continued)

*Primary Examiner* — Robert T. Crow
(74) *Attorney, Agent, or Firm* — Marshall, Gerstein & Borun LLP

(57) ABSTRACT

The disclosure relates to a method of forming a pattern having pattern elements with a plurality of sizes on a substrate surface with a tilted pen array that includes choosing a tilt geometry for a pen array with respect to a substrate, inducing the tilt geometry between the pen array and the substrate surface, and forming a pattern having pattern elements on the substrate surface with the titled pen array, whereby the size of the formed pattern elements varies across the substrate surface along the tilted axis or axes. For example, the tilt geometry is in reference to the substrate surface and comprises a first angle with respect to a first axis of the substrate and a second angle with respect to a second axis of the substrate, the second axis being perpendicular to the first axis, and at least one of the first and second angles being non-zero.

24 Claims, 14 Drawing Sheets

(56) References Cited

U.S. PATENT DOCUMENTS

| | | | |
|---|---|---|---|
| 5,846,909 | A | 12/1998 | McDevitt et al. |
| 5,908,692 | A | 6/1999 | Hamers et al. |
| 5,942,397 | A | 8/1999 | Tarlov et al. |
| 6,376,833 | B2 | 4/2002 | Shimada et al. |
| 6,500,549 | B1 | 12/2002 | Deppisch et al. |
| 6,596,346 | B2 | 7/2003 | Bernard et al. |
| 6,635,311 | B1 | 10/2003 | Mirkin et al. |
| 7,491,422 | B2 | 2/2009 | Zhang et al. |
| 2003/0040107 | A1* | 2/2003 | Hirota et al. ............... 435/287.2 |
| 2004/0037959 | A1 | 2/2004 | Mirkin et al. |
| 2004/0228962 | A1 | 11/2004 | Liu et al. |
| 2005/0112505 | A1 | 5/2005 | Huang et al. |
| 2007/0008390 | A1 | 1/2007 | Cruchon-Dupeyrat et al. |
| 2007/0131646 | A1 | 6/2007 | Donnelly et al. |
| 2007/0269747 | A1 | 11/2007 | Bahadur et al. |
| 2008/0105042 | A1 | 5/2008 | Mirkin et al. |
| 2008/0309688 | A1 | 12/2008 | Haaheim et al. |
| 2009/0205091 | A1 | 8/2009 | Haaheim et al. |
| 2011/0132220 | A1 | 6/2011 | Mirkin et al. |
| 2011/0305996 | A1 | 12/2011 | Mirkin et al. |
| 2012/0128882 | A1 | 5/2012 | Mirkin et al. |

FOREIGN PATENT DOCUMENTS

| | | |
|---|---|---|
| JP | 2003-305700 A | 10/2003 |
| WO | WO-99/48682 A1 | 9/1999 |
| WO | WO-2005/115630 A2 | 12/2005 |
| WO | WO-2009/132321 A1 | 10/2009 |
| WO | WO-2010/096591 A2 | 8/2010 |
| WO | WO-2010/096593 A2 | 8/2010 |

OTHER PUBLICATIONS

Allara et al., Spontaneously organized molecular assemblies. 1. Formation, dynamics and physical properties of n-Alkanoic acids adsorbed from solution on an oxidized aluminum surface, Langmuir, 1: 45 (1985).
Allara et al., The study of the gas-solid interaction of acetic acid with a cuprous oxide surface using reflection-absorption spectroscopy, J. Colloid Interface Sci., 49: 410-21 (1974).
Anastasiadis et al., The p120 catenin family: complex roles in adhesion, signaling and cancer, J. Cell Biol., 113:1319-34 (2000).
Andrew et al., Confining light to deep subwavelength dimensions to enable optical nanopatterning, Science, 324:917-21 (2009).
Anwander et al., Surface characterization and functionalization of MCM-41 silicas via silazane silylation, J. Phys. Chem. B, 104:3532-44 (2000).
Bain et al., A new class of self-assembled monolayers: organic thiols on gallium arsenide, Adv. Mater., 4:591-4 (1992).
Bansal et al., Electrochemical properties of (111)-oriented n-Si surfaces derivatized with covalently-attached alkyl chains, J. Phys. Chem. B, 102:1067-70 (1998).
Bansal et al., Stabilization of Si photoanodes in aqueous electrolytes through surface alkylation, J. Phys. Chem. B., 102:4058-60 (1998).
Bell, The impact of nanoscience on heterogeneous catalysis, Science, 299:1688-91 (2003).
Bernard et al., Printing patterns of proteins, Langmuir, 14:2225-9 (1998).
Bishop et al., Self-assembled monolayers: recent developments and applications, Curr. Opin. Colloid & Interface Sci., 1(1):127-36 (1996).
Brazdil et al. Resonance raman spectra of adsorbed species at solid-gas interfaces. 2. Y-Nitrosodimethylaniline and Y-Dimethylaminoazobenzene adsorbed on semiconductor oxide surfaces, J. Phys. Chem., 85, 1005-14 (1981).
Bullen et al., Electrostatically actuated dip pen nanolithography probe arrays, Sensors and Actuators A: Physical, 125:504-11 (2006).
Bullen et al., Parallel dip-pen nanolithography with arrays of individually addressable cantilevers, Appl. Phys. Lett., 84(5):789-91 (2004).

Burwell Modified silica gels as adsorbents and catalysts, Chem. Technol., 4, 370-7 (1974).
Calvert, Lithographic patterning of self-assembled films, J. Vac. Sci. Technol. B, 11:2155 (1993).
Chang et al., Structures of self-assembled monolayers of aromatic-derivatized thiols on evaporated gold and silver surfaces: implication on packing mechanism, J. Am. Chem. Soc., 116, 6792-805 (1994).
Chen et al., Do alkanethiols adsorb onto the surfaces of Tl?Ba?Ca?Cu?O-based high-temperature superconductors? The critical role of H2O content on the adsorption process, Langmuir, 12:2622-4 (1996).
Chen et al., Regiocontrolled synthesis of poly(3-alkylthiophenes) mediated by rieke zinc: Their characterization and solid-state properties, J. Am. Chem. Soc., 117:233-44 (1995).
Chen et al., Surveying the Surface Coordination Chemistry of a Superconductor: Spontaneous Adsorption of Monolayer Films of Redox-Active "Ligands" on YBa2Cu3O7-.delta, J. Am. Chem. Soc., 117(23): 6374-5 (1995).
Chen et al., Synthesis and characterization of carboxylate-modified gold nanoparticle powders dispersible in water, Langmuir, 15:1075-82 (1999).
Chidsey, Book of Abstracts, 214th ACS National Meeting, I&EC-027 (1997).
Choi et al., Modeling of a nanoscale oxide aperture opening for a NSOM probe, J. Korean Phys. Soc., 45:1659 (2004).
Chou et al., Imprint lithography with 25-nanometer resolution, Science, 272:85-7 (1996).
Dammel, Diazonaphthoquinone-based Resists, Bellingham, Wash.: SPIE—The International Society for Optical Engineering, (1993).
Delamarche et al., Microcontact printing using poly(dimethylsiloxane) stamps hydrophilized by poly(ethylene oxide) silanes, Langmuir, 19:8749 (2003).
Demers et al., Direct patterning of modified oligonucleotides on metals and insulators by dip-pen nanolithography, Science, 296:1836-8 (2002).
Donzel et al., Hydrophilic poly(dimethylsiloxane) stamps for microcontact printing, Adv. Mater., 13(15): 1164-7 (2001).
Dubois et al., Synthesis, structure, and properties of model organic surfaces, Ann. Rev. Phys. Chem., 43:437-63 (1992).
Ellison et al., Adsorption of phenyl isothiocyanate on Si(001): A 1,2-dipolar surface addition reaction, J. Phys. Chem. B, 103:6243-51 (1999).
Ellison et al., Cycloaddition chemistry on silicon(001) surfaces: The adsorption of azo-tert-butane, J. Phys. Chem. B, 102:8510-8 (1998).
Eltekova et al., Adsorption of aromatic compounds from solutions on titanium dioxide and silica, Langmuir, 3:951-7 (1987).
Engler et al., Matrix elasticity directs stem cell lineage specification, Cell, 126:677-89 (2006).
Farrusseng et al., High-throughput heterogeneous catalysis, Surf. Sci. Rep., 63:487-513 (2008).
Fenter et al., Structure of $CH_3(CH_2)_{17}SH$ self-assembled on the Ag(111) surface: An incommensurate monolayer, Langmuir, 7:2013-6 (1991).
Gates et al., New approaches to nanofabrication: molding, printing, and other techniques, Chem. Rev., 105:1171-96 (2005).
Geissler et al., Patterning: principles and some new developments, Adv. Mater., 16:1249-69 (2004).
Ginger et al., The evolution of dip-pen nanolithography, Angew. Chem. Int. Ed. Engl., 43(1):30-45 (2004).
Grabar et al., Preparation and characterization of Au colloid monolayers, Anal Chem, 67 : 735-43 (1995).
Gu et al., Electron tunneling at the semiconductor-insulator-electrolyte interface. Photocurrent studies of the n-InP-alkanethiol-ferrocyanide system, J. Phys. Chem. B, 102:9015-28 (1998).
Gui et al., Adsorption and surface structural chemistry of thiophenol, benzyl mercaptan, and alkyl mercaptans. Comparative studies at Ag(111) and Pt(111) electrodes by means of auger spectroscopy, electron energy loss spectroscopy, low-energy election diffraction, and electrochemistry, Langmuir, 7, 955-63 (1991).
Hamers et al., Formation of ordered, anisotropic organic monolayers on the Si(001) surface, J. Phys. Chem. B, 101:1489-92 (1997).
He et al., Preparation of hydrophilic poly(dimethylsiloxane) stamps by plasma-induced grafting, Langmuir, 19(17):6982-6 (2003).

(56) References Cited

OTHER PUBLICATIONS

Henderson et al., Self-assembled monolayers of ithiols, diisocyanides, and isocyanothiols on gold: "chemically sticky" surfaces for covalent attachment of metal clusters and studies of interfacial electron transfer, Inorg. Chim. Acta, 242:115-24 (1996).
Hickman et al., Combining spontaneous molecular assembly with microfabrication to pattern surfaces: selective binding of isonitriles to platinum microwires and characterization by electrochemistry and surface spectroscopy, J. Am. Chem. Soc., 111: 7271-7272 (1989).
Hickman et al., Toward orthogonal self-assembly of redox active molecules on Pt and Au: selective reaction of disulfide with Au and isocyanide with Pt, Langmuir, 8, 357-9 (1992).
Holzwarth et al., Detection of catalytic activity in combinatorial libraries of heterogeneous catalysts by IR thermography, Angew. Chem. Int. Ed., 37:2644-7 (1998).
Hong et al., A micromachined elastomeric tip array for contact printing with variable dot size and density, J. Micromech. Microeng., 18(1):015003 (2008).
Hong et al., A nanoplotter with both parallel and serial writing capabilities, Science, 288:1808-11 (2000).
Hovis et al., Cycloaddition chemistry and formation of ordered organic monolayers on silicon (001) surfaces, Surf. Sci., 402-404:1-7 (1998).
Hovis et al., Cycloaddition chemistry of 1,3-dienes on the silicon(001) surface: competition between [4+2] and [2+2] reactions, J. Phys. Chem. B, 102:6873-9 (1998).
Hovis et al., Structure and bonding of ordered organic monolayers of 1,5-cyclooctadiene on the silicon(001) surface, J. Phys. Chem. B, 101:9581-5 (1997).
Huang et al., Matrix-assisted dip-pen nanolithography and polymer pen lithography, Small, 6(10):1077-81 (2010).
Hubbard, Electrochemistry of well-defined surfaces, Acc. Chem. Res., 13:177-84 (1980).
Huc et al., Self-assembled mono- and multilayers on gold from 1,4-diisocyanobenzene and ruthenium phthalocyanine, J. Phys. Chem. B, 103: 10489-95 (1999).
Huo et al., Polymer pen lithography, Science, 321 (5896): 1658-60 (2008).
Iler, The Chemistry of Silica, Chapter 6, New York: Wiley (1979).
International Preliminary Report on Patentability for corresponding international application No. PCT/US2010/058773, date Jun. 12, 2012.
International Search Report and Written Opinion for corresponding international application No. PCT/US2010/058773, mailing date Aug. 22, 2011.
Ito et al., Pushing the limits of lithography, Nature, 406:1027-31 (2000).
James et al., Patterned protein layers on solid substrates by thin stamp microcontact printing, Langmuir, 14, 741-4 (1998).
Kingsley et al., Optical nanolithography using a scanning near-field probe with an integrated light source, Appl. Phys. Lett., 93:213103 (2008).
Koper, Fuel Cell Catalysis: A Surface Science Approach, John Wiley & Sons, (2009).
Kramer et al., Scanning probe lithography using self-assembled monolayers, Chem. Rev., 103:4367-418 (2003).
Kumar et al., Features of gold having micrometer to centimeter dimensions can be formed through a combination of stamping with an elastomeric stamp and an alkanethiol "ink" followed by chemical etching, Appl. Phys. Lett., 63:2002-4 (1993).
Kusumi et al., Mobility and cytoskeletal interactions of cell adhesion receptors, Curr. Opin. Cell Biol., 11(5):582-90 (1999).
Laibinis et al., f-Terminated alkanethiolate monolayers on surfaces of copper, silver, and gold have similar wettabilities, J. Am. Chem. Soc., 114, 1990-5 (1992).
Laibinis et al., Comparisons of self-assembled monolayers on silver and gold: mixed monolayers derived from $HS(CH_2)_{21}X$ and $HS(CH_2)_{10}Y$ (X, Y = $CH_3$, $CH_2OH$) have similar properties, Langmuir, 7:3167-73 (1991).

Leckband et al., Mechanism and dynamics of cadherin adhesion, Annu. Rev. Biomed. Eng., 8:259-87 (2006).
Lee et al., Adsorption of ordered zirconium phosphonate multilayer films on silicon and gold surfaces, J. Phys. Chem., 92 : 2597-601 (1988).
Lee et al., Protein nanoarrays generated by dip-pen nanolithography, Science, 295:1702-5 (2002).
Leggett, Scanning near-field photolithography—surface photochemistry with nanoscale spatial resolution, Chem. Soc. Rev., 35:1150-61 (2006).
Lenhert et al., Massively parallel dip-pen nanolithography of heterogeneous supported phospholipid multilayer patterns, Small, 3:71-5 (2007).
Levenson et al., Improving resolution in photolithography with a phase-shifting mask, IEEE Trans. Electr. Dev., 29(12):1828-36 (1982).
Li et al., Achieving $\lambda/20$ resolution by one-color initiation and deactivation of polymerization, Science, 324:910-3 (2009).
Li et al., Self-assembly of n-alkanethiolate monolayers on silver nanostructures: determination of the apparent thickness of the monolayer by scanning tunneling microscopy, J. Phys. Chem., 98, 11751-5 (1994).
Li et al., Technical Report No. 2: Self assembly of n-Alkanethiolate monolayers on silver nano-structures: determination of the apparent thickness of the monolayer by scanning tunneling microscopy, University of California Irvine (Jul. 12, 1994).
Liao et al., "Force-feedback" leveling of massively parallel arrays in polymer pen lithography, Nano Lett., 10(4):1335-40 (2010).
Liao et al., Force- and time-dependent feature size and shape control in molecular printing via polymer-pen lithography, Small, 6(10):1082-6 (2010).
Liu et al., E-cadherin engagement stimulates proliferation via Rac1, J. Cell Biol., 173:431-41 (2006).
Lo et al., Polypyrrole growth on $YBa_2Cu_3O_7$-L modified with a self-assembled monolayer of N-(3-aminopropyl)pyrrole: hardwiring the "electroactive hot spots" on a superconductor electrode, J. Am. Chem. Soc., 118:11295-6 (1996).
Loo et al., Interfacial chemistries for nanoscale transfer printing, J. Am. Chem. Soc., 124:7654-5 (2002).
Lunt et al., Chemical studies of the passivation of GaAs surface recombination using sulfides and thiols, J. Appl. Phys., 70:7449-67 (1991).
Lunt et al., Passivation of GaAs surface recombination with organic thiols, J. Vacuum Sci. Technol. B, 9:2333-6 (1991).
Magallon et al., Book of Abstracts, 215th ACS National Meeting, COLL-048 (1998).
Maier et al., Combinatorial and high-throughput materials science, Angew. Chem. Int. Ed., 46:6016-67 (2007).
Maoz et al., Nanoelectrochemical patterning of monolayer surfaces: toward spatially defined self-assembly of nanostructures, Adv. Mater., 11:55-61 (1999).
Maoz et al., Penetration-controlled reactions in organized monolayer assemblies. 1. Aqueous permanganate interaction with monolayer and multilayer films of long-chain surfactants, Langmuir, 3:1034-44 (1987).
Maoz et al., Penetration-controlled reactions in organized monolayers assemblies. 2. Aqueous permanganate interaction with self-assembling monolayers of long-chain surfactants, Langmuir, 3:1045-51 (1987).
Martin et al., Direct protein microarray fabrication using a hydrogel "stamper", Langmuir, 14(15):3971-5 (1998).
Matteucci et al., Synthesis of deoxyoligonucleotides on a polymer support, J Am Chem Soc, 103:3185-91 (1981).
Mayer et al., Micropatterned agarose gels for stamping arrays of proteins and gradients of proteins, Proteomics, 4(8):2366-76 (2004).
Mayya et al., A study of the partitioning of colloidal particles based on their size during electrostatic immobilization at the air-water interface using fatty amine monolayers, J. Phys. Chem. B, 101, 9790-3 (1997).
McBeath et al., Cell shape, cytoskeletal tension, and RhoA regulate stem cell lineage commitment, Dev. Cell, 6:483-95 (2004).

(56) References Cited

OTHER PUBLICATIONS

Menzel et al., Surface-confined nanoparticles as substrates for photopolymerizable self-assembled monolayers, Adv. Mater., 11:131-4 (1999).
Meyer et al., Evidence for adduct formation at the semiconductor-gas interface. Photoluminescent properties of cadmium selenide in the presence of amines, J. Am. Chem. Soc., 110: 4914-18 (1988).
Mirkin et al., Controlling the surface properties of high temperature superconductors, Adv. Mater., 9:167-73 (1997).
Mirkin, The power of the pen: development of massively parallel dip-pen nanolithography, ACS Nano, 1:79-83 (2007).
Moates et al., Infrared thermographic screening of combinatorial libraries heterogeneous catalysts, Ind. Eng. Chem. Res., 35:4801-3 (1996).
Mucic et al., Synthesis and characterization of DNA with ferrocenyl groups attached to their 5-termini: electrochemical characterization of a redox-active nucleotide monolayer, Chem Commun, 555-557 (1996).
Naber et al., High-resolution lithography with near-field optical microscopy, Scanning, 18:567-71 (1996).
Nakagawa et al., GaAs interfaces with octadecyl thiol self-assembled monolayer: structural and electrical properties, Japan J. Appl. Phys. Part I, 30:3759-62 (1991).
Nuzzo et al., Spontaneously organized molecular assemblies. 3. Preparation and properties of solution adsorbed monolayers of organic disulfides on gold surfaces, J Am Chem Soc, 109:2358-2368 (1987).
Odom et al., Improved pattern transfer in soft lithography using composite stamps, Langmuir, 18:5314-20 (2002).
Ohno et al., Nanostructural formation of self-assembled monolayer films on cleaved ALGAAs/GAAs heterojuctions, Mol. Cryst. Liq. Cryst., 295:189-92 (1997).
Patil et al., Surface derivatization of colloidal silver particles using interdigitized bilayers: a novel strategy for electrostatic immobilization of colloidal particles in thermally evaporated fatty acid/fatty amine films, Langmuir, 14, 2707-11 (1998).
Pereira et al., Modification of surface properties of alumina by plasma treatment, J. Mater. Chem., 10, 259-61 (2000).
Piner et al., 'Dip-Pen' nanolithography, Science, 283:661-3 (1999).
Porter et al., Gold and silver nanoparticles functionalized by the adsorption of dialkyl disulfides, Langmuir, 14, 7378-86 (1998).
Qi et al., A three-dimensional optical photonic crystal with designed point defects, Nature, 429:538-42 (2004).
Qin et al., Photolithography with transparent reflective photomasks, J. Vac. Sci. Technol. B, 16:98-103 (1998).
Qin et al., Elastomeric light valves, Adv. Mater., 9:407-10 (2004).
Reuter et al., Effects of gallium passivation on scanning tunneling microscope excited luminescence, MRS Proceedings, 380:119 (1995).
Salaita et al., Applications of dip-pen nanolithography, Nat. Nanotechnol., 2:145-55 (2007).
Salaita et al., Massively parallel dip-pen nanolithography with 55 000-pen two-dimensional arrays, Angew Chem Int Ed Engl., 45:7220-3 (2006).
Sangiorgi et al., Adsorption of 1-decylamine on copper, Gazz. Chim. Ital., 111:99-102 (1981).
Sastry et al., Langmuir-blodgett films of carboxylic acid derivatized silver colloidal particles: role of subphase pH on degree of cluster incorporation, J. Phys. Chem. B, 101:4954-8 (1997).
Schieker et al., Human mesenchymal stem cells at the single-cell level: simultaneous seven-colour immunofluorescence, J. Anat., 210:592-9 (2007).
Schmid et al., Siloxane polymers for high-resolution, high-accuracy soft lithography, Macromolecules, 33(8):3042-9 (2000).
Scott et al., Two-Color Single-Photon Photoinitiation and Photoinhibition for Subdiffraction Photolithography, Science, 324:913-7 (2009).
Sheen et al., A new class of organized self-assembled monolayers: Alkane thiols on GaAs (100), J. Am. Chem. Soc., 114:1514-5 (1992).

Slavov et al., Mechanism of silation of silica with hexamethyldisilazane, J. Phys. Chem. B, 104:983-9 (2000).
Smith, A proposal for maskless, zone-plate-array nanolithography, J. Vac. Sci. Technol. B, 14:4318 (1996).
Solomun et al., On the promoting effect of alkali metals on the adsorption of nitriles on the gold(100) surface, Ber. Bunsenges. Phys. Chem., 95:95-8 (1991).
Solomun et al., The interaction of nitriles with a potassium-promoted gold(100) surface, J. Phys. Chem., 95:10041-9 (1991).
Son et al., Adsorption of 4-methoxybenzyl cyanide on silver and gold surfaces investigated by fourier transform infrared spectroscopy, J. Phys. Chem., 98:8488-93 (1994).
Song, Quenching of porous silicon photoluminescenceby aromatic molecules, and surface derivatization of porous silicon with dimethyl sulfoxide, aryllithium, or alkyllithium reagents, Doctoral Dissertation, University of California at San Diego (1998).
Soriaga et al., Determination of the orientation of aromatic molecules adsorbed on platinum electrodes. The effect of solute concentration, J Am Chem Soc, 104:3937-45 (1982).
Steiner et al., Adsorption of alkanenitriles and alkanedinitriles on gold and copper, Langmuir, 8, 2771-7 (1992).
Steiner et al., Adsorption of $NPh_3$, $PPh_3$, $AsPh_3$, $SbPh_3$, and $BiPh_3$ on gold and copper, Langmuir, 8, 90-4 (1992).
Tao, Structural comparison of self-assembled monolayers of n-alkanoic acids on the surfaces of silver, copper, and aluminum, J. Am. Chem. Soc., 115:4350-8 (1993).
Taylor et al., Thermographic selection of effective catalysts from an encoded polymer-bound library, Science, 280:567-70 (1998).
Timmons et al., Investigation of fatty acid monolayers on metals by contact potential measurements, J Phys Chem, 69:984-990 (1965).
Ulman et al., Formation and structure of self-assembled monolayers, Chem. Rev., 96(4):1533-54 (1996).
Ulman, An Introduction to Ultrathin Organic Films: From Langmuir-Blodgett to Self-Assembly, Boston: Academic Press (1991).
Valden et al., Onset of catalytic activity of gold clusters on titania with the appearance of nonmetallic properties, Science, 281:1647-50 (1998).
Van Roy, The cell-cell adhesion molecule E-cadherin, Cell Mol. Life Sci., 65(23):3756-88 (2008).
Vettiger et al., The "Millipede"—more than thousand tips for future AFM storage, IBM J. Res. Dev., 44:323 (2000).
Walczak et al., Structure and interfacial properties of spontaneously adsorbed n-alkanethiolate monolayers on evaporated silver surfaces, J. Am. Chem. Soc., 113:2370-8 (1991).
Wang et al., Scanning probe contact printing, Langmuir, 19(21):8951-5 (2003).
Wang et al., Thermally actuated probe array for parallel dip-pen nanolithography, J. Vac. Sci. Technol. B, 22(6):2563-7 (2004).
Wasserman et al., Structure and reactivity of alkylsiloxane monolayers formed by reaction of alkyltrichlorosilanes on silicon substrates, Langmuir, 5:1074-1087 (1989).
Whitesides, Proceedings of the Robert A. Welch Foundation 39th Conference on Chemical Research Nanophase Chemistry, Houston, Texas, pp. 109-121 (1995).
Wilbert et al., Lithographic molding: a convenient route to structures with sub-micrometer dimensions, Adv. Mater., 7:649-52 (1995).
Xia et al., Reduction in the size of features of patterned SAMs generated by microcontact printing with mechanical compression of the stamp, Adv. Mater., 7(5):471-3 (1995).
Xia et al., Soft lithography, Angew. Chem. Int. Ed., 37(5):550-75 (1998).
Xia et al., Soft lithography, Ann. Rev. Mater. Sci., 28:153 (1998).
Xia et al., Unconventional methods for fabricating and patterning nanostructures, Chem. Rev., 99(7): 1823-48 (1999).
Xu et al., Surface coordination chemistry of $YBa_2Cu_3O_7$-L, Langmuir, 14:6505-11 (1998).
Yamamoto et al., Characterization of the surface to thiol bonding in self-assembled monolayer films of $C_{12}H_{25}SH$ on InP(100) by angle-resolved x-ray photoelectron spectroscopy, Langmuir, 15:8640-4 (1999).
Yonezawa et al., Layered nanocomposite of close-packed gold nanoparticles and $TiO_2$ gel layers, Chem. Mater., 11:33-5 (1999).

(56) References Cited

OTHER PUBLICATIONS

Yousaf et al., Using electroactive substrates to pattern the attachment of two different cell populations, Proc. Natl. Acad. Sci. USA, 98:5992-6 (2001).

Zhang et al., Dip pen nanolithography stamp tip, Nano Lett., 4(9):1649-55 (2004).

Zheng et al., Multiplexed protein arrays enabled by polymer pen lithography: addressing the inking challenge, Angew. Chem. Int. Ed., 48:7626-9 (2009).

Zheng et al., Topography printing to locally control wettability, J. Am. Chem. Soc., 128:7730-1 (2006).

* cited by examiner

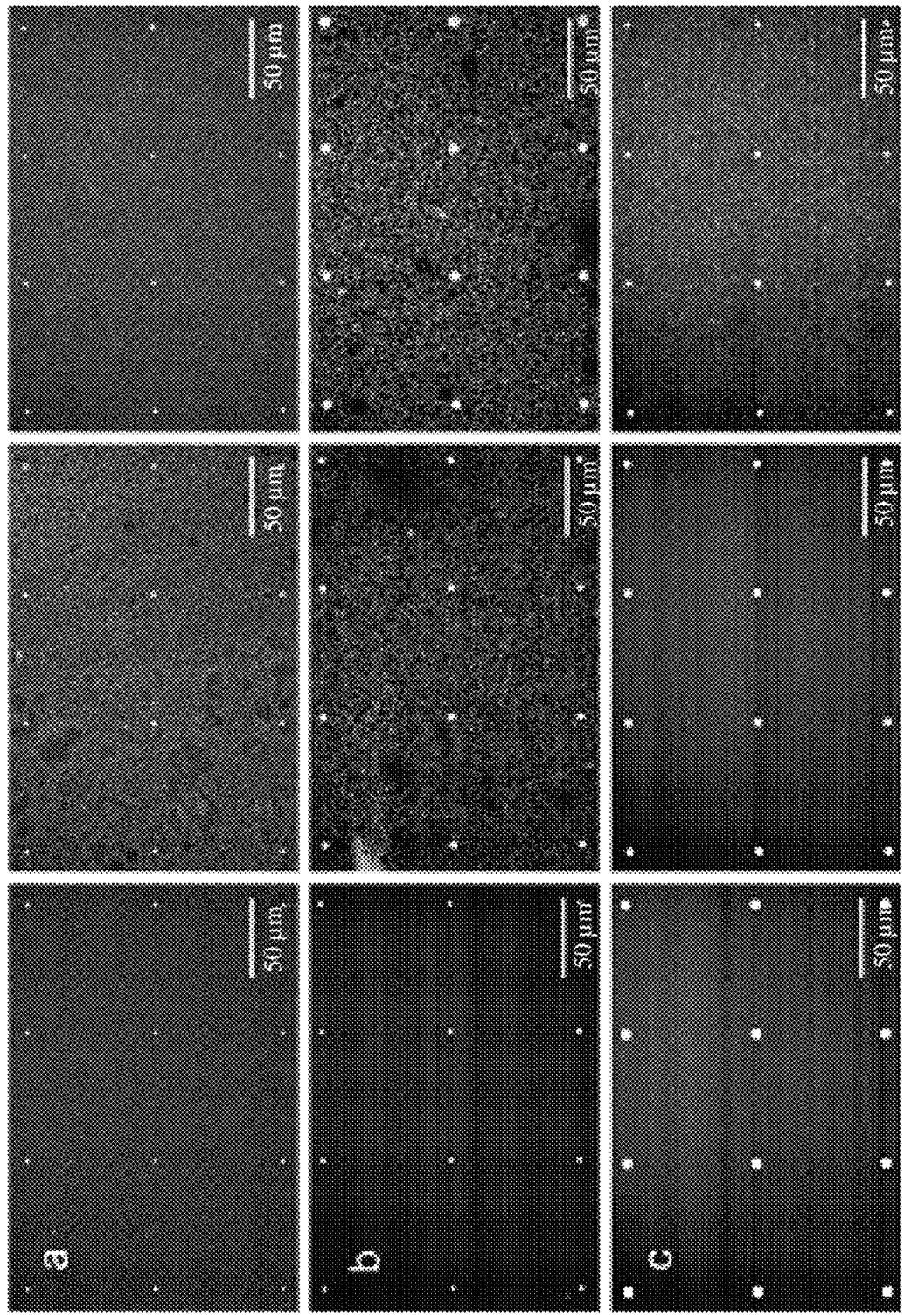
Figure 3a-c

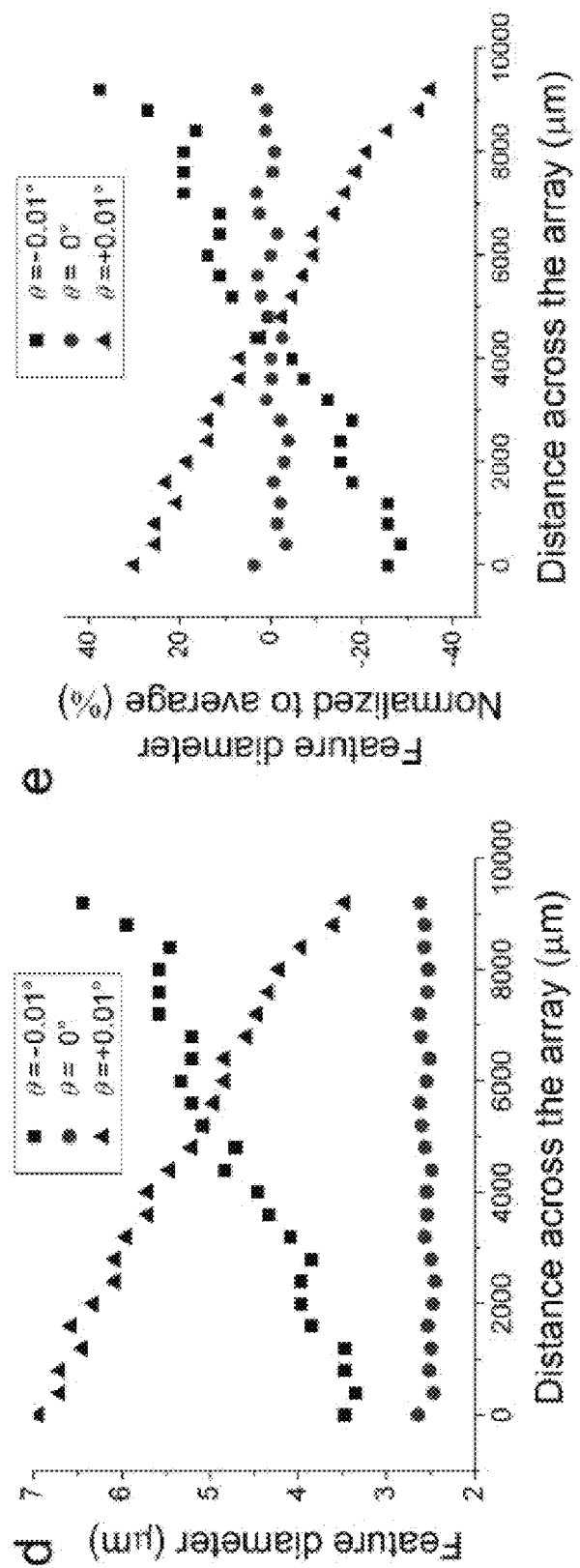
Figure 3 d,e

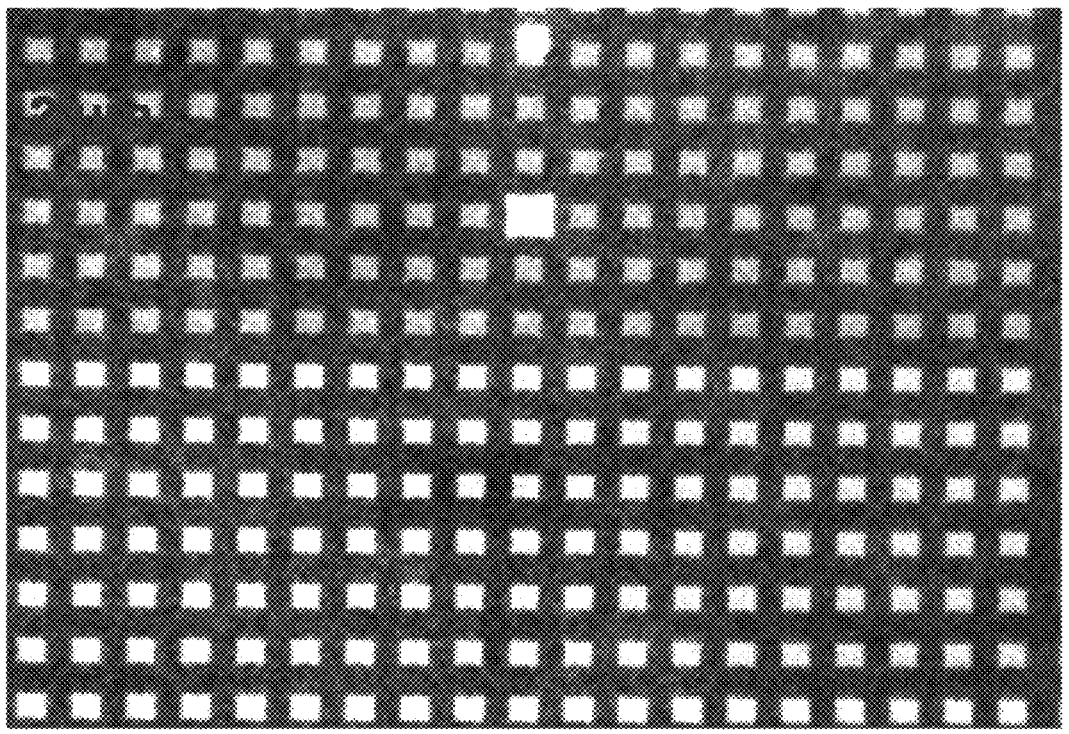
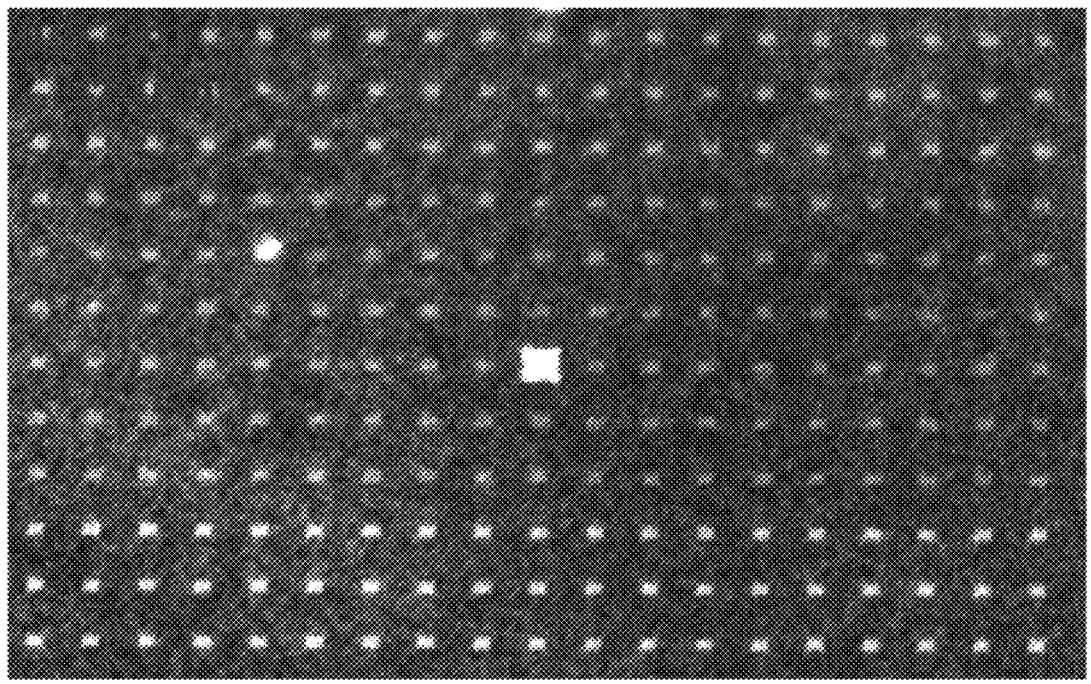
Figure 7

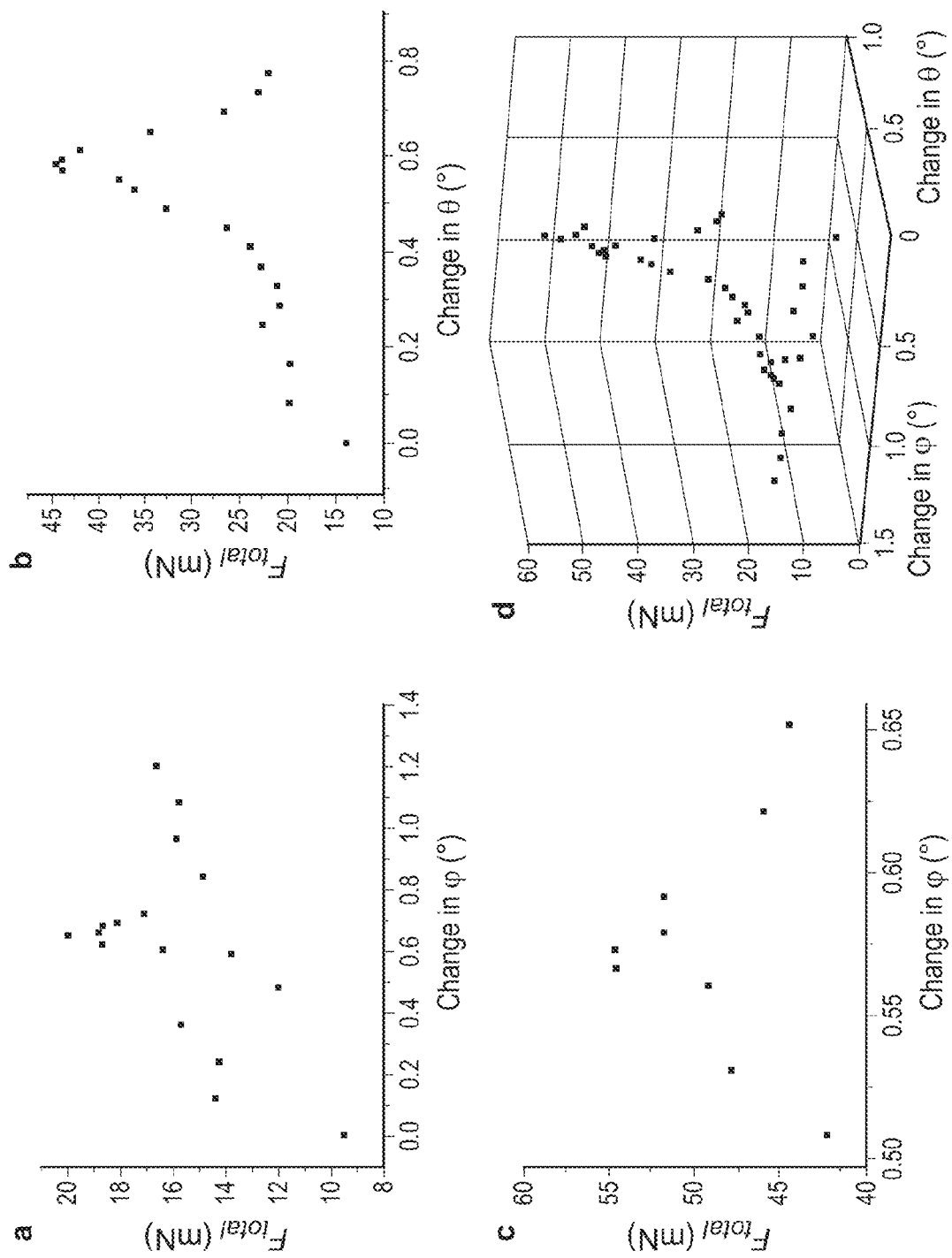
Figure 10a-d

GENERATION OF COMBINATORIAL PATTERNS BY DELIBERATE TILTING OF A POLYMER-PEN ARRAY

CROSS REFERENCE TO RELATED APPLICATIONS

This application is the U.S. national phase of International Patent Application No. PCT/US10/58773 filed Dec. 2, 2012, which claims the benefit of U.S. Provisional Patent Application Nos. 61/267,382 filed Dec. 7, 2009, and 61/292,444 filed Jan. 5, 2010, and 61/375,684 filed Aug. 20, 2010, the entire disclosures of which are incorporated herein by reference.

STATEMENT OF GOVERNMENTAL INTEREST

This invention was made with U.S. government support under Grant No. N66001-08-1-2044 awarded by the Space & Naval Warfare Systems Center (SD), Grant No. U54CA119341 awarded by the National Institutes of Health; Grant No. EEC-0647560 awarded by the National Science Foundation (NSF); and Grant No. FA9550-08-1-0124 awarded by the Air Force Office of Scientific Research. The government has certain rights in this invention.

BACKGROUND

Polymer-pen lithography (PPL) is a molecular printing technology that combines elements of dip-pen nanolithography and microcontact printing to print arbitrary patterns with nanoscale registration between features. See Huo et al., 321 Science 1658-60 (2008); Piner et al., 283 Science 661-63 (1999); Ginger et al., 43 Angew. Chem. Int. Ed. 30-45 (2004); Salaita et al., 2 Nat. Nanotech. 145-55 (2007); Kumar et al., 63 Appl. Phys. Lett. 2002-04 (1993); Xia et al., 99 G. M. Chem. Rev. 1823-48 (1999); Xia et al., 7 Adv. Mater. 471-73 (1995); and Wilbur et al., 7 Adv. Mater. 649-52 (1995). PPL has the ability to print features ranging in edge length from about 90 nm to tens of micrometers in a single writing operation. PPL offers several advantages over DPN, including higher throughput by using a massively parallel array of elastomeric tips (for example up to $10^7$ tips) and the ability to change the feature size using either contact force or dwell time. The ability to vary the feature size by varying the contact force between the tip array and the substrate is a feature unique to PPL and occurs because the elastomeric tips deform upon contact with the surface, thus increasing the contact area and in turn, the feature edge length. Recently, a quantitative relationship between the force between the tip array and the substrate and the resulting feature edge lengths was established and verified experimentally.

A challenge that arose in PPL was obtaining precise leveling between the planes of the pen array and the substrate because it was found that misalignment between the planes of the pen array and the substrate resulted in pens across the array not being in contact with the surface simultaneously and the pens not being deformed identically. Previously, optical methods were used to judge the alignment between the two planes. The optical method included pressing the pens into the surface, and when it appeared that all pens deformed by the same amount when viewed through a microscope, the arrays were judged to be level with respect to the surface. This optical leveling method was only able to level the two planes within 0.01°, which can lead to a large deviation in feature size across a 1×1 cm pen array.

Recently it was determined that by maximizing the force between the pen array and the substrate upon a given z-piezo extension, the two planes could be leveled within $1 \times 10^{-4}$ degree. Using this force feedback leveling strategy, features of 16-mercaptohexadecanoic acid were written on a gold surface with a size variance of less than 2% over a distance of 1 cm. See Liao et al., 10 Nano Lett. 1335-40 (2010). Leveling the array with respect to the substrate uses the previously established relationship between z-piezo extension and force. See Liao et al., 6 Small 1082-85 (2009).

SUMMARY OF THE INVENTION

In accordance with an embodiment of the disclosure, a method for forming a pattern having pattern elements with a plurality of sizes on a substrate surface with a tilted pen array includes choosing a tilt geometry for a pen array with respect to a substrate surface, the tilt geometry being in reference to a substrate surface and comprising a first angle of the pen array with respect to a first axis of the substrate and a second angle of the pen array with respect to a second axis of the substrate, the first and second axes being parallel to the substrate surface and perpendicular to one another, at least one of the first and second angles being non-zero, wherein a leveled position with respect to the substrate surface comprises first and second angles both equaling 0°, inducing the tilt geometry between the pen array and the substrate surface by the chosen first and second angles; and forming a pattern having pattern elements on the substrate surface with the titled pen array, whereby the size of the formed pattern elements varies across the substrate surface along the tilted axis or axes. The pen array includes a plurality of tips fixed to a common substrate layer, the tips and the common substrate layer are formed from an elastomeric polymer or elastomeric gel polymer, and the tips have a radius of curvature of less than about 1 µm.

In accordance with another embodiment of the disclosure, a method of forming a pattern having pattern elements with a plurality of sizes on a substrate surface with a tilted pen array includes choosing a range of pattern element sizes for a pattern formed on a substrate surface and choosing, based on a theoretical model, a tilt geometry for a pen array with respect to the substrate surface to achieve the chosen range of pattern element sizes, the tilt geometry being in reference to a substrate surface and comprising a first angle of the pen array with respect to a first axis of the substrate and a second angle of the pen array with respect to a second axis of the substrate, the first and second axes being parallel to the substrate surface and perpendicular to one another, at least one of the first and second angles being non-zero, wherein a leveled position with respect to the substrate surface comprises first and second angles both equaling 0°, inducing the tilt geometry between the pen array and the substrate surface by the chosen first and second angles, and forming the pattern having pattern elements on the substrate surface with the titled pen array, whereby the size of the formed pattern elements varies across the substrate surface along the tilted axis or axes and comprise the chosen range of pattern element sizes. The pen array includes a plurality of tips fixed to a common substrate layer, the tips and the common substrate layer being formed from an elastomeric polymer or elastomeric gel polymer, and the tips having a radius of curvature of less than about 1 µm.

In accordance with an embodiment of the disclosure, a substrate surface includes an array of printed indicia having a gradient of feature sizes across the array of printed indicia, wherein the array of printed indicia is printed using a pen array comprising a plurality of tips fixed to a common substrate layer tilted relative to a leveled position with respect to the substrate surface, the spacing between adjacent indicia being substantially equal to the spacing between adjacent tips of the pen array, and the array printed in a single printing step.

BRIEF DESCRIPTION OF THE DRAWINGS

FIGS. 3a-3c are scanning electron microscopy (SEM) images showing patterns made by a 10,000 pen array with (a) θ=0°, (b) θ=0.01°, and (c) θ=−0.01°;

FIG. 3d is a graph illustrating the relationship between feature size and distance along the pen array as a function of different leveling conditions;

FIG. 3e is a graph illustrating the diameters of different feature sizes for different leveling conditions, normalized to the θ=0° leveling condition;

FIG. 7 is an optical micrograph of an MHA pattern printed on gold using a tilted polymer pen array in accordance with an embodiment of the method of the disclosure;

FIGS. 10a-10c are graphs illustrating a method of leveling a polymer pen array, and specifically FIG. 10a is a graph illustrating the total force measurements resulting from tilting the pen array to vary ϕ, while holding θ constant, until a local maximum in total force is found; FIG. 10b is a graph illustrating the total force measurements resulting from tilting the pen array to vary θ, while holding ϕ constant, until a local maximum in total force is found; and FIG. 10c is a graph illustrating the total force measurements resulting from tilting of the pen array to vary ϕ, while again holding θ constant until a global maximum in total force is found; and FIG. 10d is a three-dimensional plot constructed from the graphs of FIGS. 10a-10c.

DETAILED DESCRIPTION

Figure 1:
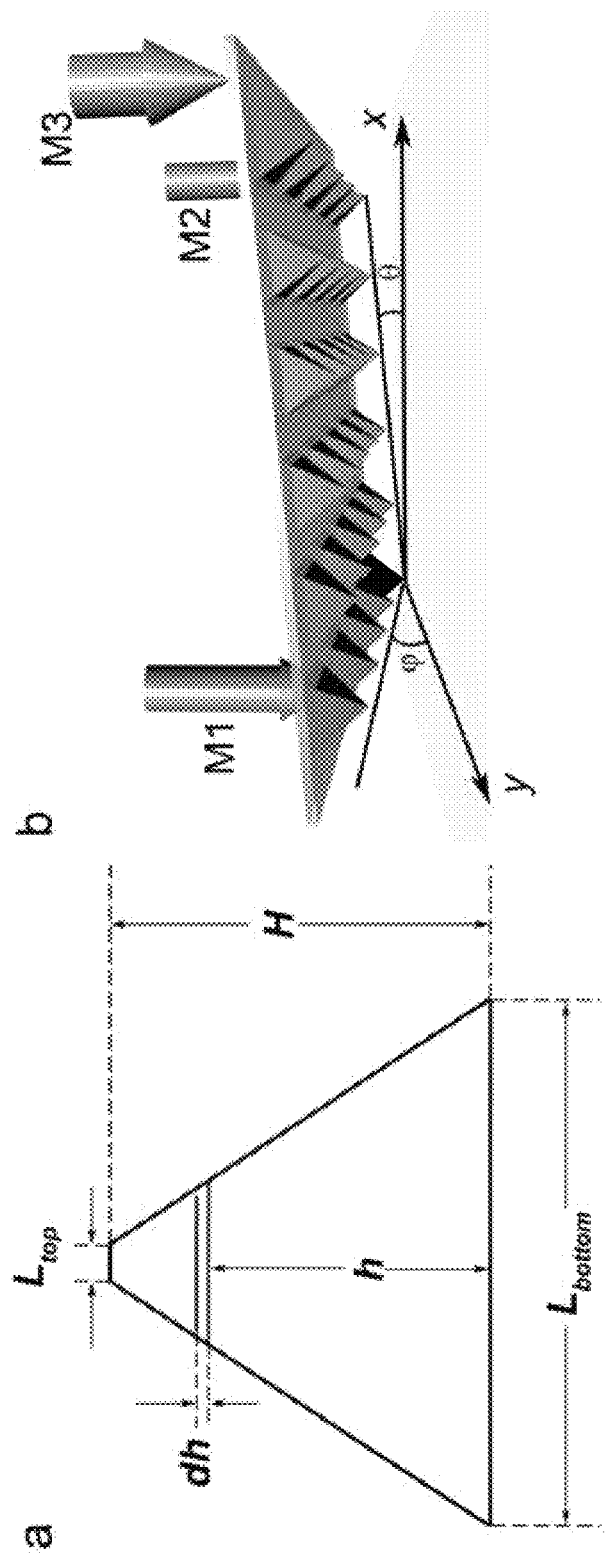
FIG. 1a is a schematic drawing of a pyramidal tip of a polymer pen tip array.
FIG. 1b is a schematic drawing illustrating an unleveled polymer pen array with arbitrary angles θ and ϕ between the pen array and the surface, the black pen illustrating the initial point of contact.

Deliberate tilting of a pen array, for example, a polymer or gel pen array, before printing can allow high-throughput combinatorial arrays of varying feature size to be quickly fabricated. The tips of the pen array can be made to deform with successively increasing amounts of applied pressure, which can be controlled by simply extending the piezo in the vertical direction (z-piezo). Controlled deformation of the tips of the pen array can be used as an adjustable variable, allowing one to control tip-substrate contact area and resulting feature size. The variance in feature size occurs because the tilt between the pen array and the substrate causes each of the pens to deform differently upon z-piezo extension, which results in features of different dimensions being produced. By controlling the deformation of the pens across the pen array through tilting of the array, control and variance of feature size produced by pens across the pen array can be achieved.

Any polymer pen lithography method can be used in the method of the present disclosure depending on the ink to be printed on the substrate. For example, Polymer Pen Lithography, Gel Pen Lithography, and Beam Pen Lithography can be used in the method of the present disclosure. For a description of Polymer Pen Lithography see International Patent Publication No. WO 2009/132321, the entire disclosure of which is incorporated herein by reference. For a description of Gel Pen Lithography see International Patent Application No. PCT/US2010/024631, the entire disclosure of which is incorporated herein by reference. For a description of Beam Pen Lithography see International Patent Application No. PCT/US2010/024633, the entire disclosure of which is incorporate herein by reference. For example, by using matrix-assisted polymer pen lithography (see Huang et al., 6 Small 1077-81 (2010)), the method of the present disclosure can be used to print various inorganic materials.

A defining characteristic of polymer pen lithography, in contrast with DPN and most contact printing strategies, which are typically viewed as pressure or force-independent, is that it exhibits both time- and pressure-dependent ink transport. As with DPN, features made by polymer pen lithography can exhibit a size that is linearly dependent on the square root of the tip-substrate contact time. This property of polymer pen lithography, which is a result of the diffusive characteristics of the ink and the small size of the delivery tips, allows one to pattern sub-micron features with high precision and reproducibility (variation of feature size is less than 10% under the same experimental conditions). The pressure dependence of polymer pen lithography derives from the deformable or compressible nature of the elastomer pyramid array. Indeed, the microscopic, preferably pyramidal, tips can be made to deform with successively increasing amounts of applied pressure, which can be controlled by simply extending the piezo in the vertical direction (z-piezo). Although such deformation has been regarded as a major drawback in contact printing (it can result in "roof" collapse and limit feature size resolution), with polymer pen lithography, the controlled deformation can be used as an adjustable variable, allowing one to control tip-substrate contact area and resulting feature size. Within a pressure range allowed by z-piezo extension of about 5 to about 25 μm, one can observe a near linear relationship between piezo extension and feature size at a fixed contact time. When the z-piezo extends 1 µm or more, the tips exhibit a significant and controllable deformation.

Beam Pen Lithography (BPL) can allow for patterning of sub-micron features over large areas with flexible pattern design, convenient, selective pen tip addressability, and low fabrication cost. As compared to conventional photolithography or contact printing in which only pre-formed patterns (i.e. photomasks) can be duplicated, BPL can provide the flexibility to create different patterns by controlling the movement of a pen array over the substrate and/or by selectively illuminating one or more of the tips in the pen array. Thus, multiple "dots", for example, can be fabricated to achieve arbitrary features. This approach bypasses the need for, and costs associated with, photomask fabrication in conventional photolithography, allowing one to arbitrarily make many different types of structures without the hurdle of designing a new master via a throughput-impeded serial process. An embodiment of BPL generally includes contacting a photosensitive substrate, for example, a substrate having a photosensitive layer coated thereon, with a pen array and irradiating a surface of a pen array with a radiation source, such as, for example, UV light. The pen array generally includes tips having a blocking layer disposed on the sidewalls of the tips and an aperture formed therein exposing the tip end. As a result of the blocking layer blocking the radiation (e.g., by reflection), the radiation is transmitted through the transparent polymer and out the portion of the transparent polymer exposed by the aperture (i.e., the tip end). Patterning using the transmitted radiation can be performed in a contact mode, in which the pen array is brought into contact with the substrate surface, or in a non-contact mode, in which the pen array is brought near the substrate surface, or in a combination thereof in which a subset of one or more pens in the pen array is brought into contact with the substrate surface. In principle, the type of radiation used with the Beam Pen Lithography is not limited. Radiation in the wavelength range of about 300 nm to about 600 nm is preferred, optionally 380 nm to 420 nm, for example about 365 nm, about 400 nm, or about 436 nm. For example, the radiation optionally can have a minimum wavelength of about 300, 350, 400, 450, 500, 550, or 600 nm. For example, the radiation optionally can have a maximum wavelength of about 300, 350, 400, 450, 500, 550, or 600 nm.

The photosensitive layer disposed on the substrate can be exposed by the radiation transmitted through the polymer tip for any suitable time, for example, in a range of about 1 second to about 1 minute. For example, the minimum exposure time can be about 1, 2, 3, 4, 5, 6, 7, 8, 9, 10, 20, 30, 40, 50, or 60 seconds. For example, the maximum exposure time can be about 1, 2, 3, 4, 5, 6, 7, 8, 9, 10, 20, 30, 40, 50, or 60 seconds.

The photosensitive layer can be developed, for example, by any suitable process known in the art. For example, when a resist layer is used, the exposed resist layer can be developed for about 30 seconds in MF319 (Rohm & Haas Electronic Materials LLC). The resist layer can be a positive resist or a negative resist. If a positive resist layer is used, developing of the resist layer removes the exposed portion of the resist layer. If a negative resist layer is used, developing of the resist layer removes the unexposed portion of the resist layer. Optionally, Beam Pen Lithography can further include depositing a patterning layer on the substrate surface after exposure followed by lift off of the resist layer to thereby form the patterning layer into the indicia printed on the resist layer by BPL. The patterning layer can be a metal, for example, and can be deposited, for example, by thermal evaporation. The resist lift off can be performed using, for example, acetone.

Polymer Pen Arrays

As used herein, the term "polymer pen arrays" generally refers to pen arrays for use in any polymer pen lithography method including, but not limited to, Polymer Pen Lithography, Gel Pen Lithography, and Beam Pen Lithography. Polymer pen arrays generally include elastomeric tips without cantilevers to deliver ink to a printing surface or otherwise pattern a substrate surface. The tips are preferably made of polydimethylsiloxane (PDMS) or agarose gel. For Beam Pen Lithography, the tips are formed from a material which is at least translucent to the wavelength of radiation intended for use in patterning, e.g., in a range of 300 nm to 600 nm.

A polymer pen array can include any number of tips, preferably having a pyramidal shape, which can be made by molding with a master prepared by conventional photolithography and subsequent wet chemical etching. Contemplated numbers of tips include about 1000 tips to about 15 million tips, or greater. The number of tips of the polymer pen array can be greater than about 1 million, greater than about 2 million, greater than about 3 million, greater than about 4 million, greater than 5 million tips, greater than 6 million, greater than 7 million, greater than 8 million, greater than 9 million, greater than 10 million, greater than 11 million, greater than 12 million, greater than 13 million, greater than 14 million, or greater than 15 million tips. When the sharp tips of the polymer pens are brought in contact with a substrate, ink is delivered at the points of contact.

The tips can be designed to have any shape or spacing between them, as needed. The shape of each tip can be the same or different from other tips of the array. Contemplated tip shapes include spheroid, hemispheroid, toroid, polyhedron, cone, cylinder, and pyramid (trigonal or square). The tips are sharp, so that they are suitable for forming submicron patterns, e.g., less than about 500 nm. For example, the tip ends can have a diameter in a range of about 50 nm to about 1 µm. For example, the minimum diameter can be about 50, 55, 60, 65, 70, 75, 80, 85, 90, 95, 100, 150, 200, 250, 300, 350, 400, 450, 500, 550, 600, 650, 700, 750, 800, 850, 900, 950, or 1000 nm. For example, the maximum diameter can be about 50, 55, 60, 65, 70, 75, 80, 85, 90, 95, 100, 150, 200, 250, 300, 350, 400, 450, 500, 550, 600, 650, 700, 750, 800, 850, 900, 950, or 1000 nm. The sharpness of the tip is measured by its radius of curvature, and the radius of curvature of the tips disclosed herein is below 1 µm, and can be less than about 0.9 µm, less than about 0.8 µm, less than about 0.7 µm, less than about 0.6 µm, less than about 0.5 µm, less than about 0.4 µm, less than about 0.3 µm, less than about 0.2 µm, less than about 0.1 µm, less than about 90 nm, less than about 80 nm, less than about 70 nm, less than about 60 nm, or less than about 50 nm.

The tips of the pen array can be designed to have any desired thickness, for example, the thickness of the tip array is about 50 nm to about 50 µm, about 10 µm to about 50 µm, about 50 nm to about 1 µm, about 50 nm to about 500 nm, about 50 nm to about 400 nm, about 50 nm to about 300 nm, about 50 nm to about 200 nm, or about 50 nm to about 100 nm. For example, the minimum thickness can be about 50 nm, 60 nm, 70 nm, 80 nm, 90 nm, 100 nm, 200 nm, 300 nm, 400 nm, 500 nm, 600 nm, 700 nm, 800 nm, 900 nm, 1 µm, 5 µm, 10 µm, 15 µm, 20 µm, 25 µm, 30 µm, 35 µm, 40 µm, 45 µm, or 50 µm. For example, the maximum thickness can be about 50 nm, 60 nm, 70 nm, 80 nm, 90 nm, 100 nm, 200 nm, 300 nm, 400 nm, 500 nm, 600 nm, 700 nm, 800 nm, 900 nm, 1 µm, 5 µm, 10 µm, 15 µm, 20 µm, 25 µm, 30 µm, 35 µm, 40 µm, 45 µm, or 50 µm. The thickness of the pen array can be decreased as the rigidity of the polymer used to form the tip substrate layer increases. For example, for a gel polymer (e.g., agarose), the tip array can have a thickness in a range of about 10 µm to about 50 µm.

For other polymers (e.g., PDMS), for example, the tip array can have a thickness of about 50 nm to about 1 µm. As used herein, the thickness of the tip array refers to the distance from the tip end to the base end of a tip. The tips can be arranged randomly or in any pattern, including a regular periodic pattern (e.g., in columns and rows, in a circular or radial pattern, or the like). The tips have a base portion fixed to the tip substrate layer. The base portion preferably is larger than the tip end portion. The base portion can have an edge length in a range of about 1 µm to about 50 µm, or about 5 µm to about 50 µm. For example, the minimum edge length can be about 1, 2, 3, 4, 5, 6, 7, 8, 9, 10, 11, 12, 13, 14, 15, 16, 17, 18, 19, 20, 22, 24, 26, 28, 30, 32, 34, 36, 38, 40, 42, 44, 46, 48, or 50 µm. For example, the maximum edge length can be about 1, 2, 3, 4, 5, 6, 7, 8, 9, 10, 11, 12, 13, 14, 15, 16, 17, 18, 19, 20, 22, 24, 26, 28, 30, 32, 34, 36, 38, 40, 42, 44, 46, 48, or 50 µm. The tip array is preferably formed such that the tip ends lie in a single plane, although alternative arrangements are also contemplated.

The polymers suitable for use in the pen array can be any polymer having a compressibility and/or deformability compatible with the lithographic methods. In one embodiment, the polymer is deformable; in another embodiment the polymer is compressible. Polymeric materials suitable for use in the pen array can have linear or branched backbones, and can be crosslinked or non-crosslinked, depending upon the particular polymer and the degree of compressibility desired for the tip. Cross-linkers refer to multi-functional monomers capable of forming two or more covalent bonds between polymer molecules. Non-limiting examples of cross-linkers include trimethylolpropane trimethacrylate (TMPTMA), divinylbenzene, di-epoxies, tri-epoxies, tetra-epoxies, di-vinyl ethers, tri-vinyl ethers, tetra-vinyl ethers, and combinations thereof.

Thermoplastic or thermosetting polymers can be used, as can crosslinked elastomers. In general, the polymers can be porous and/or amorphous. A variety of elastomeric polymeric materials are contemplated, including polymers of the general classes of silicone polymers and epoxy polymers. Polymers having low glass transition temperatures such as, for example, below 25° C. or more preferably below −50° C., can be used. Diglycidyl ethers of bisphenol A can be used, in addition to compounds based on aromatic amine, triazine, and cycloaliphatic backbones. Another example includes Novolac polymers. Other contemplated elastomeric polymers include methylchlorosilanes, ethylchlorosilanes, and phenylchlorosilanes, polydimethylsiloxane (PDMS). Other materials include polyethylene, polystyrene, polybutadiene, polyurethane, polyisoprene, polyacrylic rubber, fluorosilicone rubber, and fluoroelastomers.

Further examples of suitable polymers that may be used to form a tip can be found in U.S. Pat. No. 5,776,748; U.S. Pat. No. 6,596,346; and U.S. Pat. No. 6,500,549, each of which is hereby incorporated by reference in its entirety. Other suitable polymers include those disclosed by He et al., Langmuir 2003, 19, 6982-6986; Donzel et al., Adv. Mater. 2001, 13, 1164-1167; and Martin et al., Langmuir, 1998, 14-15, 3791-3795. Hydrophobic polymers such as polydimethylsiloxane can be modified either chemically or physically by, for example, exposure to a solution of a strong oxidizer or to an oxygen plasma.

Alternatively, the polymer of the tip array can be a polymer gel. The polymer gel can comprise any suitable gel, including hydrogels and organogels. For example, the polymer gel can be a silicone hydrogel, a branched polysaccharide gel, an unbranched polysaccharide gel, a polyacrylamide gel, a polyethylene oxide gel, a cross-linked polyethylene oxide gel, a poly(2-acrylamido-2-methyl-1-propanesulfonic acid) (polyAMPS) gel, a polyvinylpyrrolidone gel, a cross-linked polyvinylpyrrolidone gel, a methylcellulose gel, a hyaluronan gel, and combinations thereof. For example, the polymer gel can be an agarose gel. By weight, gels are mostly liquid, for example, gels can be greater than 95% liquid, yet behave like solids due to the presence of a cross-linked network within the liquid. The gel polymer can be, for example, hydrophilic and/or porous, allowing for absorption of a pattern composition.

The polymer of the pen array has a suitable compression modulus and surface hardness to prevent collapse of the polymer during inking and printing, but too high a modulus and too great a surface hardness can lead to a brittle material that cannot adapt and conform to a substrate surface during printing. As disclosed in Schmid, et al., Macromolecules, 33:3042 (2000), vinyl and hydrosilane prepolymers can be tailored to provide polymers of different modulus and surface hardness. Thus, in some cases, the polymer is a mixture of vinyl and hydrosilane prepolymers, where the weight ratio of vinyl prepolymer to hydrosilane crosslinker is about 5:1 to about 20:1, about 7:1 to about 15:1, or about 8:1 to about 12:1.

The polymers of the pen array preferably will have a surface hardness of about 0.2% to about 3.5% of glass, as measured by resistance of a surface to penetration by a hard sphere with a diameter of 1 mm, compared to the resistance of a glass surface (as described in Schmid, et al., Macromolecules, 33:3042 (2000) at p 3044). The surface hardness can be about 0.3% to about 3.3%, about 0.4% to about 3.2%, about 0.5% to about 3.0%, or about 0.7% to about 2.7%. The polymers of the tip array can have a compression modulus of about 10 MPa to about 300 MPa. The pen array preferably comprises a compressible polymer or a deformable polymer which is Hookean under pressures of about 10 MPa to about 300 MPa. The linear relationship between pressure exerted on the pen array and the feature size allows for control of the indicia printed using the disclosed methods and pen arrays (see FIG. 2b).

The pen array can comprise a polymer that has adsorption and/or absorption properties for the patterning composition, such that the tip array acts as its own patterning composition reservoir. For example, PDMS is known to adsorb patterning inks, see, e.g., U.S. Patent Publication No. 2004/228962, Zhang, et al., Nano Lett. 4, 1649 (2004), and Wang et al., Langmuir 19, 8951 (2003).

The tips of the pen array can be fixed to a common substrate. For polymer pen arrays for use with Beam Pen Lithography, the common substrate can be formed of a transparent polymer. The tips can be arranged randomly or in any pattern, including a regular periodic pattern (e.g., in columns and rows, in a circular pattern, or the like). The common substrate can comprise, for example, an elastomeric layer, which can comprise the same polymer that forms the tips of the tip array, or can comprise an elastomeric polymer that is different from that of the tip array. For example, the common substrate can be a gel backing layer. Suitable gels include those described herein in connection with polymer gels for use as tip materials. The elastomeric layer can have a thickness of about 50 µm to about 100 µm. The common substrate layer can have any suitable thickness, for example, in a range of about 50 µm to about 5 mm, about 50 µm to about 100 µm, or about 1 mm to about 5 mm. For example, the common substrate layer can have a minimum thickness of about 50, 100, 200, 300, 400, 500, 600, 700, 800, 900, 1000, 2000, 3000, 4000, or 5000 µm. For example, the common substrate layer can have a maximum thickness of about 50, 100, 200, 300, 400, 500, 600, 700, 800, 900, 1000, 2000, 3000, 4000, or 5000 µm. The thickness of the common substrate layer can be decreased as the rigidity of the polymer used to form the common substrate layer increases. For example, for a gel polymer (e.g., agarose), the common substrate layer can have a thickness in a range of about 1 mm to about 5 mm. For other, more rigid, polymers (e.g., PDMS) the common substrate layer can have a thickness in a range of about 50 µm to about 100 µm, for example. The tip array can be affixed or adhered to a rigid support (e.g., glass, such as a glass slide). In various cases, the common substrate, the tip array, and/or the rigid support, if present, is translucent or transparent. In a specific case, each is translucent or transparent. The combined thickness of the tip substrate layer and the tips can be in range of about 50 µm to about 5 mm. The thickness of combination of the tip array and common substrate can be less than about 200 µm, preferably less than about 150 µm, or more preferably about 100 µm.

The polymer backing layer is preferably adhered to a rigid support (e.g., a glass, silicon, quartz, ceramic, polymer, or any combination thereof), e.g., prior to or via curing of the polymer. The rigid support is preferably highly rigid and has a highly planar surface upon which to mount the array (e.g., silica glass, quartz, and the like). The rigid support and thin backing layer significantly improve the uniformity of the polymer pen array over large areas, such as a three inch wafer surface, and make possible the leveling and uniform, controlled use of the array.

The tip-to-tip spacing between adjacent tips (tip pitch) can be in any desired range, including a range of about 1 µm to about over 10 mm; or about 20 µm to about 1 mm. For example, the minimum tip-to-tip spacing can be about 1 µm, 2 µm, 3 µm, 4 µm, 5 µm, 6 µm, 7 µm, 8 µm, 9 µm, 10 µm, 15 µm, 20 µm, 25 µm, 30 µm, 35 µm, 40 µm, 45 µm, 50 µm, 55 µm, 60 µm, 65 µm, 70 µm, 75 µm, 80 µm, 85 µm, 90 µm, 95 µm, 100 µm, 200 µm, 300 µm, 400 µm, 500 µm, 600 µm, 700 µm, 800 µm, 900 µm, 1 mm, 2 mm, 3 mm, 4 mm, 5 mm, 6 mm, 7 mm, 8 mm, 9 mm, or 10 mm. For example, the maximum tip-to-tip spacing can be about 1 µm, 2 µm, 3 µm, 4 µm, 5 µm, 6 µm, 7 µm, 8 µm, 9 µm, 10 µm, 15 µm, 20 µm, 25 µm, 30 µm, 35 µm, 40 µm, 45 µm, 50 µm, 55 µm, 60 µm, 65 µm, 70 µm, 75 µm, 80 µm, 85 µm, 90 µm, 95 µm, 100 µm, 200 µm, 300 µm, 400 µm, 500 µm, 600 µm, 700 µm, 800 µm, 900 µm, 1 mm, 2 mm, 3 mm, 4 mm, 5 mm, 6 mm, 7 mm, 8 mm, 9 mm, or 10 mm.

Polymer pen arrays for use in Beam Pen Lithography generally include a pen array with each tip having a blocking layer disposed thereon, and with an aperture defined in the blocking layer, exposing the transparent tip end (e.g., the photosensitive layer-contacting end of each of the tips). The blocking layer can be coated on the sidewalls of the tips and on portions of the common substrate layer between the tips. The blocking layer serves as a radiation blocking layer, channeling the radiation through the material of the tip and out the exposed tip end. The tips can be used to both channel the radiation to a surface in a massively parallel scanning probe lithographic process and to control one or more parameters such as the distance between the tip and the substrate, and the degree of tip deformation. Control of such parameters can allow one to take advantage of near-field effects. In one embodiment, the tips are elastomeric and reversibly deformable, which can allow the tip array to be brought in contact with the substrate without damage to the substrate or the tip array. This contact can ensure the generation of near-field effects.

The blocking layer on the polymer tip sidewalls serves as a radiation blocking layer, allowing the radiation illuminated on a surface of the substrate layer opposite the surface to which the tips are fixed to be emitted only through the tip end exposed by the aperture defined in the blocking layer. The exposure of a substrate pre-coated with a resist layer with the radiation channeled through the tip ends of the tip array can allow for the formation of a single dot per tip for each exposure. The blocking layer can be formed of any material suitable for blocking (e.g., reflecting) a type of radiation used in the lithography process. For example, the blocking layer can be a metal, such as gold, when used with UV light. Other suitable blocking layers include, but are not limited to, gold, chromium, titanium, silver, copper, nickel, silicon, aluminum, opaque organic molecules and polymers, and combinations thereof. The blocking layer can have any suitable thickness, for example, in a range of about 40 nm to about 500 nm. For example, the minimum thickness can be about 40, 45, 50, 55, 60, 65, 70, 75, 80, 85, 90, 95, 100, 150, 200, 250, 300, 350, 400, 450, or 500 nm. For example, the maximum thickness can be about 40, 45, 50, 55, 60, 65, 70, 75, 80, 85, 90, 95, 100, 150, 200, 250, 300, 350, 400, 450, or 500 nm.

As with polymer pen arrays for Polymer Pen Lithography and Gel Pen Lithography, the tips of the pen array for use with BPL can be made by molding with a master prepared by conventional photolithography and subsequent wet chemical etching. Optionally, the tips can be cleaned, for example, using oxygen plasma, prior to coating with the blocking layer. The blocking layer can be disposed on the tips by any suitable process, including coating, for example, spin-coating, the tips with the blocking layer.

An aperture in the blocking layer can be formed by any suitable method, including, for example, focused ion beam (FIB) methods or using a lift-off method. The lift-off method can be a dry lift off method. One suitable approach includes applying an adhesive, such as poly(methyl methacrylate) (PMMA) on top of the blocking layer of the tip array, and removing a portion of the adhesive material disposed at the substrate contacting end of the tips by contacting the pen array to a clean and flat surface, for example, a glass surface. The tips can then be immersed in an etching solution to remove the exposed portion of the blocking layer to form the aperture and expose the material of the tip, e.g. the transparent polymer. The remaining adhesive material protects the covered surfaces of the blocking layer from being etched during the etching step. The adhesive can be, for example, PMMA, poly(ethylene glycol) (PEG), polyacrylonitrile, and combinations thereof.

Alternatively, a simple contact approach can be used in which a pen array having the blocking layer is brought in contact with a glass slide or other surface coated with an adhesive material, such as PMMA. Other suitable adhesive materials include, for example, PMMA, PEG, polyacrylonitrile, and combinations thereof. Upon removal of the pen tip from surface coated with the adhesive material, the adhesive material removes the contacted portion of the blocking layer, thereby defining an aperture and exposing the tip material, e.g. the transparent polymer.

In either of the above described aperture forming methods, the size of the aperture formed can be controlled by applying different external forces on the backside of the BPL pen array. As a result of the flexibility of elastomeric tips, the application of force on the backside of the BPL tip array can be used to control the contact area between the tips and adhesive material surface. For example, the BPL pen array can include pyramidal tips, with each pyramid-shaped tip being covered by a gold blocking layer having a small aperture defined in the blocking layer at the very end of the tip. The size of the aperture does not significantly change from tip to tip. For example, the size of the aperture can vary less than about 10% from tip to tip. The size of the aperture can be tailored over the 200 nm to 1 to 10 µm ranges, for example, by controlling contact force. For example, the aperture can have a diameter in a range of about 5 nm to about 5 µm, about 30 nm to about 500 nm, or about 200 nm to about 5 µm. For example, the minimum aperture diameter can be about 5, 10, 15, 20, 25, 30, 35, 40, 45, 50, 55, 60, 65, 70, 75, 80, 85, 90, 95, 100, 200, 300, 400, 500, 600, 700, 800, 900 1000, 1500, 2000, 2500, 3000, 3500, 4000, 4500, or 5000 nm. For example, the maximum aperture diameter can be about 5, 10, 15, 20, 25, 30, 35, 40, 45, 50, 55, 60, 65, 70, 75, 80, 85, 90, 95, 100, 200, 300, 400, 500, 600, 700, 800, 900 1000, 1500, 2000, 2500, 3000, 3500, 4000, 4500, or 5000 nm. The contact force optionally can be in a range of about 0.002 N to about 0.2 N for a 1 cm² pen array.

Tilting of the Polymer Pen Array

Assuming perfect leveling, the total force F exerted on a substrate surface by a polymer pen array (measured by a force sensor beneath the substrate) is related to the change in height of the polymer pen Z, as shown in Equation 1:

$$F(Z) = \frac{NEL_{bottom}L_{top}}{H}Z \qquad \text{Equation 1}$$

wherein N is the total number of pens in the array, E is the compression modulus of the elastomer used, H is the total height of the pyramidal tip prior to compression, $L_{bottom}$ is the edge length at the bottom surface of the pyramidal tip, and $L_{top}$ is the edge length at the top surface of the pyramidal tip. See Liao et al., 10 Nano Lett. 1335-40 (2010). Under perfect leveling, the change in height Z is equal to the z-piezo extension $Z_0$. FIG. 1a is a schematic drawing of the pyramidal tip illustrating the dimensions of the tip. The pyramidal tip can be formed, for example, of poly-(dimethylsiloxane) (PDMS).

The compression modulus E of PDMS, for example, depends on the compression ratio, which is described by the Mooney-Rivlin equation. For example, a two stage model of the compression modulus can be employed such that there exists a threshold value of the z-piezo extension $z_t$, below which $E=E_1$ and above which $E=E_2$. For example, for PDMS, $E_1$ can equal 1.38 MPa and $E_2$ can equal 8.97 MPa. Thus, the force can be determined by Equations 2 and 3 for different values of Z.

$$F = NE_1 L_{bottom} L_{top} \frac{Z}{H}, \text{ when } Z \leq z_t \qquad \text{Equation 2}$$

$$F = NE_1 L_{bottom} L_{top} \frac{z_t}{H} + NE_2 L_{bottom} L_{top} \frac{Z-z_t}{H}, \text{ when } Z > z_t \qquad \text{Equation 3}$$

Referring to FIG. 1b, the tilting between the array and the substrate surface can be described by two angles θ and φ, which are related to the x- and y-axes between the plane of the pen array and the plane of the substrate surface. For a pen array having a regular periodic pattern of tips, for example, the x- and y-axes can be disposed parallel to the rows and columns of tips in the regular periodic pattern, respectively. To bring the pen array in contact with or near to the substrate surface, the array and substrate are brought together in the z-axis direction, perpendicular to the x- and y-axes. Likewise, to compress pens against the surface, the surface and pen array are brought together in the z-axis direction, with increased force applied after initial contact. Under z-piezo extension, the compression of each pen varies with θ and φ, the z-piezo extension, and the distance of the particular pen from the closet pen to the surface $N_x$ and $N_y$, along the x- and y-axes, respectively. If the compression of the first pen to contact the surface is $Z_0$, the $Z_{pen}$ for any single pen in the array can be calculated using Equation 4:

$$Z_{pen}(N_x,N_y,\theta,\phi)=Z_0-DN_x\sin(\theta)-DN_y\sin(\phi), \qquad \text{Equation 4:}$$

wherein D is the spacing between pens in the pen array, and $N_x$ and $N_y$ are the number of pens from the first pen to contact the surface along the x and y axes, respectively.

The force generated by any single pen on the surface can be calculated as a function of Z, θ, φ, $N_x$, and $N_y$ using Equation 5 or 6, depending on the value of Z:

$$F(N_x, N_y, \theta, \varphi) = \frac{E_1 L_{bottom} L_{top}}{H}(Z_0 - DN_x\sin(\theta) - DN_y\sin(\varphi)), \qquad \text{Equation 5}$$
$$\text{when } Z \leq z_t$$

$$F(N_x, N_y, \theta, \varphi) = \frac{E_1 L_{bottom} L_{top}}{H}Z_t + \frac{E_2 L_{bottom} L_{top}}{H} \qquad \text{Equation 6}$$
$$(Z_0 - z_t - DN_x\sin(\theta) - DN_y\sin(\varphi)), \text{ when } Z > z_t$$

Figure 2:
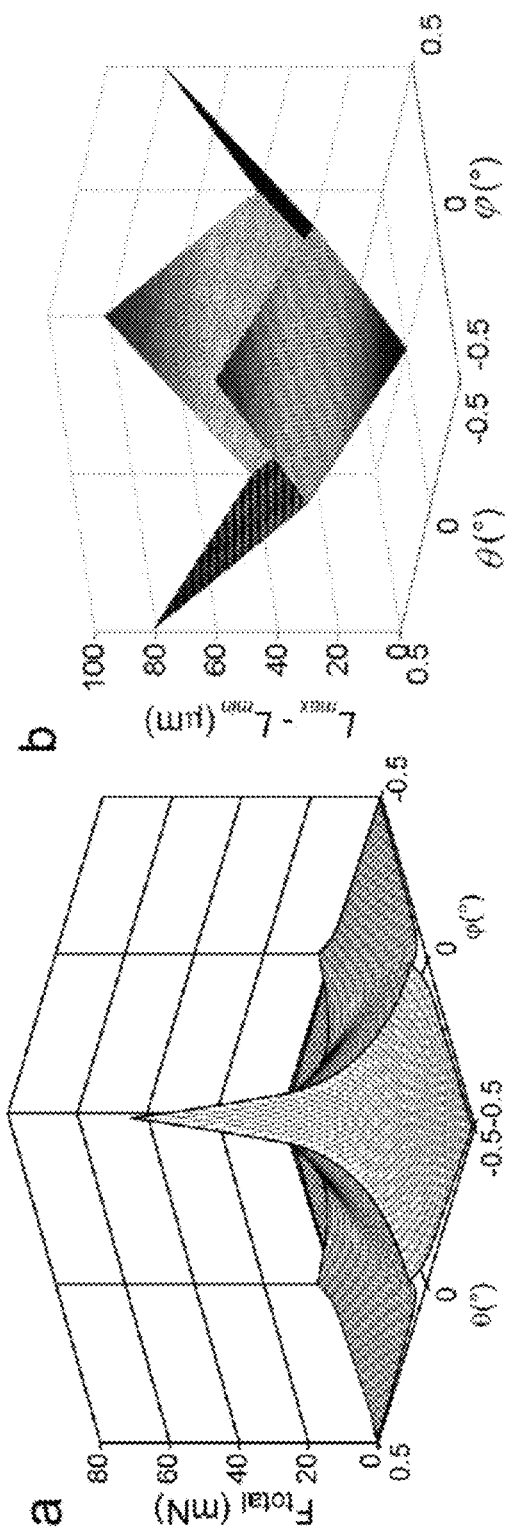
FIG. 2a is a graph showing the predicted total force as a function of tilting angles (θ, ϕ) for a 1 cm×1 cm pen array with 80 μm pitch between pens.
FIG. 2b is a graph showing the difference between the maximum and minimum feature size as a function of tilt for a 1 cm×1 cm pen array with 80 μm pitch between pens.

Referring to FIG. 2a, using the above basic model, the relationship between total force and the tilt of the array can be calculated. FIG. 2b illustrates the calculated maximum and minimum feature size as a function of the tilting angles (θ and φ). FIGS. 2a and 2b demonstrate the sensitive dependence of feature size on the tilt between the array and the substrate surface.

The total force can be calculated using Equation 7:

$$F_{total}(\theta, \varphi) = \sum_{N_x} \sum_{N_y} F(N_x, N_y, \theta, \varphi) \qquad \text{Equation 7}$$

Because $F_{total}$ is a function of θ and φ, when these angles are changed, $F_{total}$ between the pen array and the surface also changes for the same z-piezo extension ($Z_0$). From this relationship it can be concluded that at the perfect leveling position, (θ, φ)=(0, 0), the total force between the tip array and the surface reaches a global maximum. For any given value of θ, $F_{total}$ reaches a local maximum value when φ=0, and vice versa. As θ and φ approach 0, the gradient in force with respect to changes in the angle, ∂F/∂θ and ∂F/∂φ, increases and is not a function of $Z_0$ as shown in Equations 8 and 9:

$$\frac{\partial F_{total}}{\partial \theta} = \sum_{N_x} \sum_{N_y} \frac{\partial F}{\partial \theta} \qquad \text{Equation 8}$$

$$= -\sum_{N_x} \sum_{N_y} \frac{E_1 L_{bottom} L_{top}}{H} DN_x\cos(\theta), \text{ when } Z \leq z_t$$

$$\frac{\partial F_{total}}{\partial \theta} = \sum_{N_x} \sum_{N_y} \frac{\partial F}{\partial \theta}$$

$$= -\sum_{N_x} \sum_{N_y} \frac{E_2 L_{bottom} L_{top}}{H} DN_x\cos(\theta), \text{ when } Z > z_t$$

-continued $$\frac{\partial F_{total}}{\partial \varphi} = \sum_{N_x}\sum_{N_y}\frac{\partial F}{\partial \varphi}$$

$$= -\sum_{N_x}\sum_{N_y}\frac{E_1 L_{bottom} L_{top}}{H}DN_y\cos(\varphi), \text{ when } Z \le z_t$$

Equation 9

$$\frac{\partial F_{total}}{\partial \varphi} = \sum_{N_x}\sum_{N_y}\frac{\partial F}{\partial \varphi}$$

$$= -\sum_{N_x}\sum_{N_y}\frac{E_2 L_{bottom} L_{top}}{H}DN_y\cos(\varphi), \text{ when } Z > z_t$$

Based on this model, an iterative process for attaining perfect leveling between the two planes was devised. Such a leveling method can achieve leveling of the pen array within at least about 0.004°, and more preferably within at least about $1.6\times10^{-4}$ degrees when using a force sensor having a sensitivity of about 0.1 mN. It may be possible to achieve more accurate leveling with a force sensor having increased sensitivity. Leveling is accomplished by first contacting a surface with the pen array and measuring a force exerted on the surface by the pen array. The force can be measured in any suitable way. For example, the force can be measured by placing a force sensor beneath the surface. Alternatively, the force sensor can be the contacted surface. The pen array and/or the surface is then tilted to vary one of the angles, e.g., θ, by a tilt angle increment while keeping the other angle, φ, constant, and the total force exerted by the pen array on the surface is again measured. This process is repeated until a local maximum of the total force is found. The position of the pen array once the local maximum of the total force is measured is the optimized position for θ. Referring to FIG. 10a, the measured values of the total force can be plotted as a function of the change in θ to determine when a local maximum of the total force has been measured. The pen array and/or the surface is next tilted to vary the other one of the angles, φ, by a tilt angle increment while holding θ at the previously determined optimized position and measuring the total force exerted by the pen array on the surface. This process is repeated until a local maximum of the total force is measured. The position of the pen array once the local maximum of the total force is measured is the optimized position for φ. Referring to FIG. 10b, the measured values of the force can be plotted as a function of the change in φ to determine when a local maximum of the total force has been measured. The tilt of the pen is then finely varied to vary the optimized position of the first varied angle, θ, while holding φ at the previously determined optimized position until a global maximum of the total force exerted by the pen array is found. Referring to FIG. 10c, the measured values of the total force can be plotted as a function of the change in θ to determine when a global maximum of the total force has been measured. FIG. 10d illustrates a three-dimensional plot generated from FIGS. 10a-10c illustrating the above-described leveling method. This routine, or suitable equivalent, can be incorporated into a software algorithm to receive force values and control an automated stage for computer-controlled leveling of a pen array. The features produced after leveling by this force feedback strategy vary only by about 2% across the 1 cm of writing surface with the 15,000 pen array. FIGS. 3a-3c illustrate the patterns made by a 10,000 pen array with (a) θ=0°, (b) θ=0.01°, and (c) θ=−0.01°. FIG. 3d illustrates the relationship between the feature size and distance along the pen array as a function of the different leveling conditions.

FIG. 3e illustrates the diameters of different feature sizes for different leveling conditions, normalized to the θ=0° leveling condition.

In the above-described leveling method, the tilt angle increment for varying either or both of θ and φ can be in a range of about $1.6\times10^{-4}$ degrees to about 0.1°, about 0.0005° to about 0.05°, about 0.005° to about 0.01°, or about 0.001° to about 0.05°. For example, the minimum tilt angle increment can be about 0.00016, 0.0002, 0.0003, 0.0004, 0.0005, 0.0006, 0.0007, 0.0008, 0.0009, 0.001, 0.002, 0.003, 0.004, 0.005, 0.006, 0.007, 0.008, 0.009, 0.01, 0.02, 0.03, 0.04, 0.05, 0.06, 0.07, 0.08, 0.09, and 0.1°. For example, the maximum tilt angle increment can be about 0.00016, 0.0002, 0.0003, 0.0004, 0.0005, 0.0006, 0.0007, 0.0008, 0.0009, 0.001, 0.002, 0.003, 0.004, 0.005, 0.006, 0.007, 0.008, 0.009, 0.01, 0.02, 0.03, 0.04, 0.05, 0.06, 0.07, 0.08, 0.09, and 0.1°.

The angles of the pen array can be adjusted by tilting one or both of the pen array and the surface. For example, the pen array alone can be tilted, the surface alone can be tilted, or both the pen array and the surface can be tilted. For example, the tilting of the pen array can be achieved by providing a motor-controlled, multi-axis stage attached to the pen array, and controlling the degree of extension of one or more motors to induce the desired tilt angles. For example, referring to FIG. 1b, three motors M1, M2, and M3, can hold the pen array. When the two motors M1 and M3 are fixed and the motor M2 is adjusted, the pen array will be tilted in the φ-direction. For example, when the two motors M1 and M3 are fixed and the motor M2 is increased by 100 µm, φ will increase by about 0.08°. When the two motors M2 and M3 are fixed and the motor M1 is increased by 100 µm, θ will increase about 0.04°. Any other method of adjusting the pen array and/or the surface relative to the pen array can be used. Tilting can also be achieved, for example, by holding the pen array in the level position and tilting the substrate surface relative to the pen array.

By utilizing the model developed for force feedback leveling of the pen array, the pen array can be intentionally and precisely tilted with respect to the perfect leveling position to create a combinatorial array of features across a surface. Such a combinatorial array of features can be printed in a single printing operation. For example, by first leveling the pen array and then by controllably varying the tilt angles, e.g., θ and φ, the size of each feature printed by the pens of the pen array will vary controllably and predictably, with the dimensions of each feature being spatially encoded. The pen array can be leveled, for example, using force feedback leveling or other optical leveling means.

Using Equation 7, the size of each feature made by a given pen can be calculated. The degree of tilt and step size for varying tilt are not limitations of the invention in principle, and may vary with the particular apparatus used to carry out the invention. For example, θ can be varied in a range of about −20° to about 20°, about −15° to about 15°, about −10° to about 10°, about −5° to about 5°, about −6° to about 6°, about −0.1° to about 0.1°, about −0.05° to about 0.05°, about −0.01° to about 0.01°, about −0.001° to about 0.001°, and about −0.0001° to about 0.0001°. For example, θ can have a minimum value of about −20, −18, −16, −14, −12, −10, −8, −6, −4, −2, −1, −0.5, −0.1, −0.05, −0.01, −0.001, −0.0001, 0, 0.0001, 0.001, 0.01, 0.05, 0.1, 0.5, 1, 2, 4, 6, 8, 10, 12, 14, 16, 18, or 20°. For example, θ can have a maximum value of about −20, −18, −16, −14, −12, −10, −8, −6, −4, −2, −1, −0.5, −0.1, −0.05, −0.01, −0.001, −0.0001, 0, 0.0001, 0.001, 0.01, 0.05, 0.1, 0.5, 1, 2, 4, 6, 8, 10, 12, 14, 16, 18, or 20°. For example, φ can be varied in a range of −20° to about 20°, about −15° to about 15°, about −10° to about 10°, about −6° to about 6°, about −5° to about 5°, about −0.01° to about 0.1°, about −0.05° to about 0.05°, about −0.01° to about 0.01°, about −0.001° to about 0.001°, and about −0.0001° to about 0.0001°. For example, φ can have a minimum value of about −20, −18, −16, −14, −12, −10, −8, −6, −4, −2, −1, −0.5, −0.1, −0.05, −0.01, −0.001, −0.0001, 0, 0.0001, 0.001, 0.01, 0.05, 0.1, 0.5, 1, 2, 4, 6, 8, 10, 12, 14, 16, 18, or 20°. For example, φ can have a maximum value of about −20, −18, −16, −14, −12, −10, −8, −6, −4, −2, −1, −0.5, −0.1, −0.05, −0.01, −0.001, −0.0001, 0, 0.0001, 0.001, 0.01, 0.05, 0.1, 0.5, 1, 2, 4, 6, 8, 10, 12, 14, 16, 18, or 20°. For larger tilt angles, for example, angles having a magnitude larger than 6°, it may be necessary to use an object such as a wedge placed beneath the substrate or a substrate stage of a polymer pen machine to assist in achieving the larger tilt angle. One or both of the tilt angles, θ and φ can be varied to generate a combinatorial array of features across the surface. For example, in one embodiment one of the tilt angles can be held at 0°, while the other tilt angle is chosen to be a non-zero value. When both tilt angles are chosen to be non-zero values, the tilt angles can be chosen to have the same or different degrees of tilt. The tilt angles can also be chosen to have the same or different sign. For example, the tilt angle θ can be chosen to be a positive angle, while the tilt angle φ can be chosen to be a negative angle. The tilt angles can be chosen to have different magnitudes. For example, the tilt angle θ can be chosen to be 0.1° and the tilt angle φ can be chosen to be 0.5°. The tilt angles can be controllably varied within $1\times10^{-4}$ degrees, for example.

Figure 4:
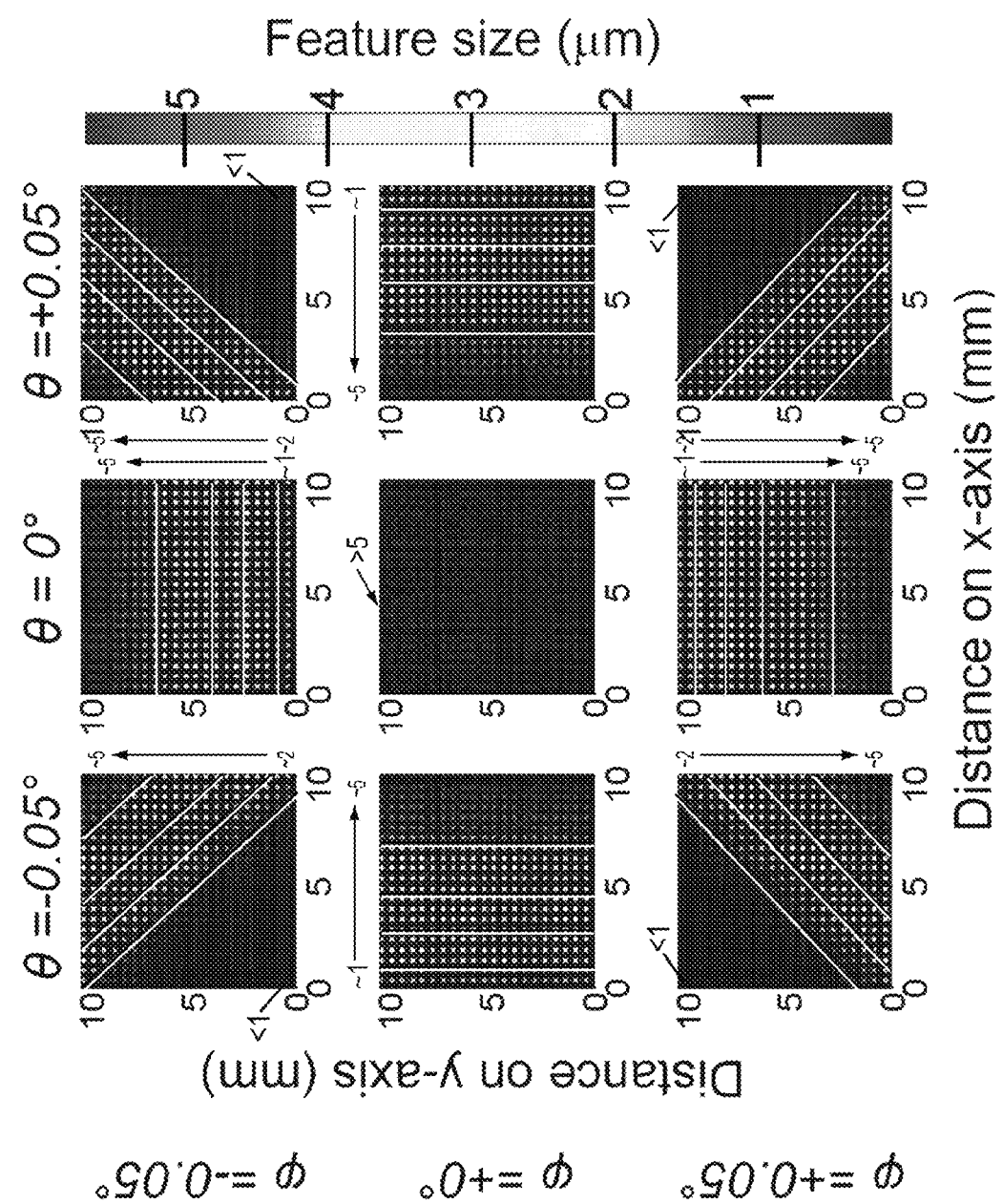
FIG. 4 is a graph illustrating the distribution of calculated feature size as a function of tilting angles (θ, ϕ) for a 20×20 pen array with 500 μm pitch between pens and a z-piezo extension of about 12 μm.
Figure 6:
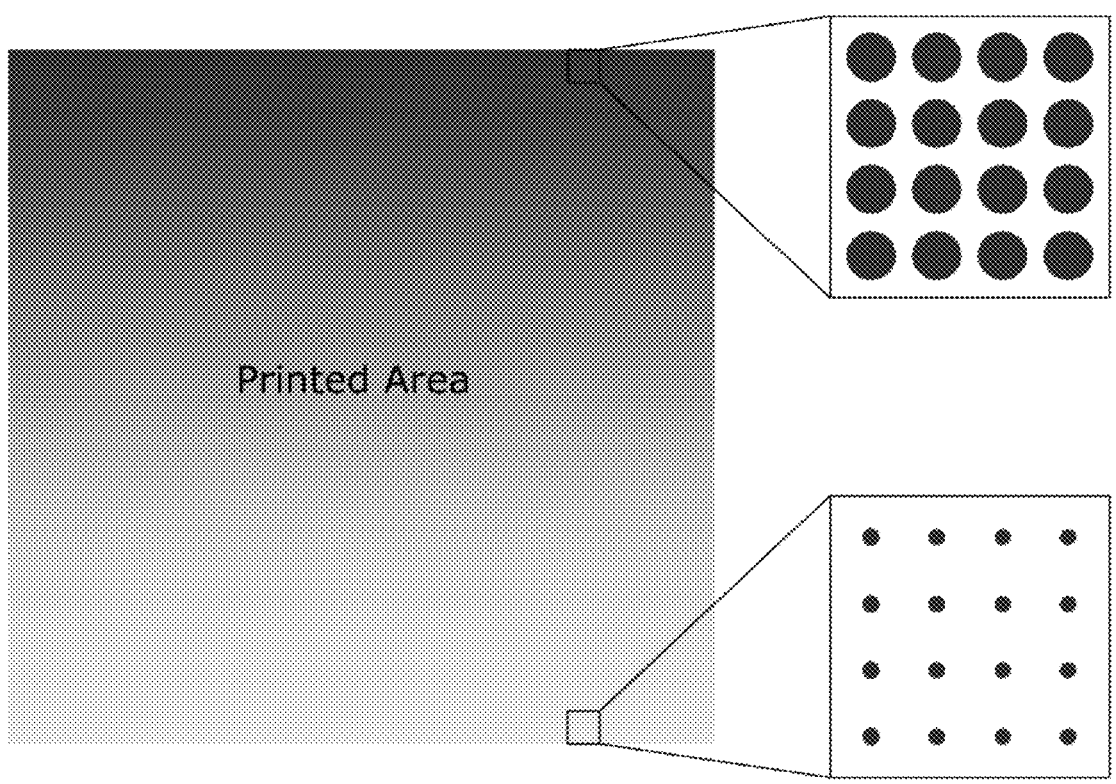
FIG. 6 is a schematic drawing illustrating the variation in feature size in patterns written on a substrate deposited by a deliberately tilted polymer pen array.

As shown in FIG. 4, by intentionally tilting the array, patterns with a gradient of feature sizes can be created. Feature sizes vary in one axis, while remaining constant along the other axis. Thus, an array can be created where, for example, each row contains patterns of the same feature size, and the feature size decreases down a column. The redundancy of the feature size across a row can allow for statistically significant numbers to be obtained for each feature size. As illustrated in FIG. 6, patterns formed by deliberately tilting the pen array relative to the substrate include variation in feature size, while the pitch remains constant throughout the substrate. The spacing (i.e., the pitch) between adjacent elements of the pattern or printed indicia can be substantially equal to the tip-to-tip spacing of adjacent tips of the pen array.

Referring again to FIG. 2b, feature sizes across the combinatorial array can range from tens of nanometers to micron sized features. The difference in feature size across the combinatorial array can range from about 5 nm to about 100 μm, about 10 nm to about 100 μm. For example, the difference in feature size can be at a minimum about 5 nm, 10 nm, 20 nm, 40 nm, 50 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm 950 nm, 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 20 μm, 30 μm, 40 μm, 50 μm, 60 μm, 70 μm, 80 μm, 90 μm, or 100 μm. For example, the difference in feature size can be at a maximum about 5 nm, 10 nm, 20 nm, 40 nm, 50 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm 950 nm, 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 20 μm, 30 μm, 40 μm, 50 μm, 60 μm, 70 μm, 80 μm, 90 μm, or 100 μm. For example, the difference in size between adjacent features can be about 5 nm.

The substrate surface can be contacted with a pen array a plurality of times, wherein the pen array, the substrate surface or both move laterally with respect to one another to allow for different portions of the substrate surface to be contacted. The time and pressure of each contacting step can be the same or different, depending upon the desired pattern. Increased pressure can be applied by applying a force in the z-axis direction, perpendicular to the x- and y-axes of the substrate. For example, increasing the time and/or pressure of the contacting step can produce pattern elements having larger feature sizes. Additionally, the tilt geometry (tilt angles with respect to a substrate surface) of the pen array for each contacting step can be the same or different. When patterning using beam pen lithography, patterning can also be achieved when one or more pens are disposed in a non-contact mode, by irradiating the substrate surface with the radiation transmitted through the apertures in the tip(s) while the tip(s) of the array are in close proximity to the substrate surface. The pen array, the substrate surface, or both can be moved laterally with respect to one another to allow for different portions of the substrate surface to be irradiated. The irradiation time for each irradiating step can be the same or different to produce features having the same or different sizes.

Force Dependent Feature Size

A defining characteristic of polymer pen lithography methods, in contrast with DPN and most contact printing strategies, which are typically viewed as pressure or force-independent, is that polymer pen lithography methods exhibit both time- and pressure-dependent ink transport.

The force dependence of the feature size when printing with polymer pen lithography methods can be predicted using the above-described force model. Specifically, the edge length of the printed feature $L_{feature}$ can be estimated using Equation 10.

$$L_{feature} = L_{top} + \frac{v}{NEL_{top}}F \qquad \text{Equation 10}$$

wherein $L_{top}$ is the edge length at the top surface of the pyramidal tip, v is Poisson's ratio of the elastomer used to form the pens, N is the total number of pens in the pen array, E is the compression modulus of the elastomer used to form the pens, and F is the force generated by the pen array on the surface. Increased force can be generated by applying a pressure on the pen array in the z-axis direction, perpendicular to the x- and y-axes of the substrate. For example, the Poisson's ratio can be in a range of about 0.3 to about 0.5, about 0.4 to about 0.5, or about 0.3 to about 0.4. Other suitable values Poisson's ratio include, for example, about 0.3, 0.31, 0.32, 0.33, 0.34, 0.35, 0.36, 0.37, 0.38, 0.39, 0.4, 0.41, 0.42, 0.43, 0.44, 0.45, 0.46, 0.47, 0.48, 0.49, and 0.5. For example, when PDMS is used as the elastomeric polymer, the Poisson's ratio is about 0.3.

As described above, a two stage model of the compression modulus can be employed such that there exists a threshold value of the z-piezo extension $z_t$, below which, $E=E_1=1.38$ MPa and above which $E=E_2=8.97$ MPa. Thus, the edge length of the printed feature can be determined by Equations 11 and 12 for different values of Z.

$$L_{feature} = L_{top} + \frac{v}{NE_1L_{top}}F, \text{ when } Z \le z_t \qquad \text{Equation 11}$$

$$L_{feature} = \frac{v}{NE_2L_{top}}F + L_{top} + vL_{bottom}\frac{z_t}{H}\left(1 - \frac{\varepsilon_1}{\varepsilon_2}\right), \qquad \text{Equation 12}$$
$$\text{when } Z > z_t$$

Patterning Compositions

For polymer pen lithography methods utilizing a patterning composition, the pen array can be coated with a patterning composition, for example, by immersing the pen array in a patterning solution. The patterning composition can be, for example, adsorbed or absorbed onto to the pens of the pen array. Patterning compositions suitable for use in the disclosed methods include both homogeneous and heterogeneous compositions, the latter referring to a composition having more than one component. The patterning composition is coated on the tip array. The term "coating," as used herein, refers both to coating of the tip array as well adsorption and absorption by the tip array of the patterning composition. Upon coating of the tip array with the patterning composition, the patterning composition can be patterned on a substrate surface by contacting the coated tip array with the substrate surface to deposit the patterning composition onto the substrate surface. For a description of suitable patterning compositions for use with Polymer Pen Lithography see, for example, International Patent Publication No. WO 2009/132321, the entire disclosure of which is incorporated herein by reference. For a description of suitable patterning compositions for use with Gel Pen Lithography see, for example, International Patent Application No. PCT/US2010/024631, the entire disclosure of which is incorporated herein by reference.

Patterning compositions can be liquids, solids, semi-solids, and the like. Patterning compositions suitable for use include, but are not limited to, molecular solutions, polymer solutions, pastes, gels, creams, glues, resins, epoxies, adhesives, metal films, particulates, solders, etchants, and combinations thereof. When using gel polymer pen arrays, wet inks can be directly patterned on a substrate surface. Wet inks include inks in the liquid state, including, for example, salt solutions, proteins in buffer, and etchants. The gel polymer pen array can also be used to pattern a patterning composition without the need to include patterning composition carriers in the patterning composition. For example, the patterning composition can be a biomaterial (e.g., albumin) free of exogenous carriers. Such ink carriers are known in the art, and include phospholipids, PEG, hydrogel PEG-DMA, and agarose, for example.

Patterning compositions can include materials such as, but not limited to, monolayer-forming species, thin film-forming species, oils, colloids, metals, pre-formed metal nanoparticles, metal nanoparticle precursors, metal complexes, metal oxides, ceramics, organic species (e.g., moieties comprising a carbon-carbon bond, such as small molecules, polymers, polymer precursors, proteins, antibodies, and the like), polymers (e.g., both non-biological polymers and biological polymers such as single and double stranded DNA, RNA, and the like), polymer precursors, dendrimers, nanoparticles, and combinations thereof. In some embodiments, one or more components of a patterning composition includes a functional group suitable for associating with a substrate, for example, by forming a chemical bond, by an ionic interaction, by a Van der Waals interaction, by an electrostatic interaction, by magnetism, by adhesion, and combinations thereof.

In some embodiments, the composition can be formulated to control its viscosity. Parameters that can control ink viscosity include, but are not limited to, solvent composition, solvent concentration, thickener composition, thickener concentration, particles size of a component, the molecular weight of a polymeric component, the degree of cross-linking of a polymeric component, the free volume (i.e., porosity) of a component, the swellability of a component, ionic interactions between ink components (e.g., solvent-thickener interactions), and combinations thereof.

In some embodiments, the patterning composition comprises an additive, such as a solvent, a thickening agent, an ionic species (e.g., a cation, an anion, a zwitterion, etc.) the concentration of which can be selected to adjust one or more of the viscosity, the dielectric constant, the conductivity, the tonicity, the density, and the like.

Suitable thickening agents include, but are not limited to, metal salts of carboxyalkylcellulose derivatives (e.g., sodium carboxymethylcellulose), alkylcellulose derivatives (e.g., methylcellulose and ethylcellulose), partially oxidized alkylcellulose derivatives (e.g., hydroxyethylcellulose, hydroxypropylcellulose and hydroxypropylmethylcellulose), starches, polyacrylamide gels, homopolymers of poly-N-vinylpyrrolidone, poly(alkyl ethers) (e.g., polyethylene oxide, polyethylene glycol, and polypropylene oxide), agar, agarose, xanthan gums, gelatin, dendrimers, colloidal silicon dioxide, lipids (e.g., fats, oils, steroids, waxes, glycerides of fatty acids, such as oleic, linoleic, linolenic, and arachidonic acid, and lipid bilayers such as from phosphocholine) and combinations thereof. In some embodiments, a thickener is present in a concentration of about 0.5% to about 25%, about 1% to about 20%, or about 5% to about 15% by weight of a patterning composition.

Suitable solvents for a patterning composition include, but are not limited to, water, C1-C8 alcohols (e.g., methanol, ethanol, propanol and butanol), C6-C12 straight chain, branched and cyclic hydrocarbons (e.g., hexane and cyclohexane), C6-C14 aryl and aralkyl hydrocarbons (e.g., benzene and toluene), C3-C10 alkyl ketones (e.g., acetone), C3-C10 esters (e.g., ethyl acetate), C4-C10 alkyl ethers, and combinations thereof. In some embodiments, a solvent is present in a concentration of about 1% to about 99%, about 5% to about 95%, about 10% to about 90%, about 15% to about 95%, about 25% to about 95%, about 50% to about 95%, or about 75% to about 95% by weight of a patterning composition.

Patterning compositions can comprise an etchant. As used herein, an "etchant" refers to a component that can react with a surface to remove a portion of the surface. Thus, an etchant is used to form a subtractive feature by reacting with a surface and forming at least one of a volatile and/or soluble material that can be removed from the substrate, or a residue, particulate, or fragment that can be removed from the substrate by, for example, a rinsing or cleaning method. In some embodiments, an etchant is present in a concentration of about 0.5% to about 95%, about 1% to about 90%, about 2% to about 85%, about 0.5% to about 10%, or about 1% to about 10% by weight of the patterning composition.

Etchants suitable for use in the methods disclosed herein include, but are not limited to, an acidic etchant, a basic etchant, a fluoride-based etchant, and combinations thereof. Acidic etchants suitable for use include, but are not limited to, sulfuric acid, trifluoromethanesulfonic acid, fluorosulfonic acid, trifluoroacetic acid, hydrofluoric acid, hydrochloric acid, carborane acid, and combinations thereof. Basic etchants suitable for use include, but are not limited to, sodium hydroxide, potassium hydroxide, ammonium hydroxide, tetraalkylammonium hydroxide ammonia, ethanolamine, ethylenediamine, and combinations thereof. Fluoride-based etchants suitable for use include, but are not limited to, ammonium fluoride, lithium fluoride, sodium fluoride, potassium fluoride, rubidium fluoride, cesium fluoride, francium fluoride, antimony fluoride, calcium fluoride, ammonium tetrafluoroborate, potassium tetrafluoroborate, and combinations thereof. A hole array can be fabricated through directly etching a gold thin film with a commercial gold etchant using a gel polymer pen array. The diameter of the holes increases with increased contact time and/or applied force between the pen array and the substrate.

In some embodiments, the patterning composition includes a reactive component. As used herein, a "reactive component" refers to a compound or species that has a chemical interaction with a substrate. In some embodiments, a reactive component in the ink penetrates or diffuses into the substrate. In some embodiments, a reactive component transforms, binds, or promotes binding to exposed functional groups on the surface of the substrate. Reactive components can include, but are not limited to, ions, free radicals, metals, acids, bases, metal salts, organic reagents, and combinations thereof. Reactive components further include, without limitation, monolayer-forming species such as thiols, hydroxides, amines, silanols, siloxanes, and the like, and other monolayer-forming species known to a person of ordinary skill in the art. The reactive component can also include, for example, photo-activated species. The reactive component can be present in a concentration of about 0.001% to about 100%, about 0.001% to about 50%, about 0.001% to about 25%, about 0.001% to about 10%, about 0.001% to about 5%, about 0.001% to about 2%, about 0.001% to about 1%, about 0.001% to about 0.5%, about 0.001% to about 0.05%, about 0.01% to about 10%, about 0.01% to about 5%, about 0.01% to about 2%, about 0.01% to about 1%, about 10% to about 100%, about 50% to about 99%, about 70% to about 95%, about 80% to about 99%, about 0.001%, about 0.005%, about 0.01%, about 0.1%, about 0.5%, about 1%, about 2%, or about 5% weight of the patterning composition.

The patterning composition can further comprise a conductive and/or semi-conductive component. As used herein, a "conductive component" refers to a compound or species that can transfer or move electrical charge. Conductive and semi-conductive components include, but are not limited to, a metal, a nanoparticle, a polymer, a cream solder, a resin, and combinations thereof. In some embodiments, a conductive component is present in a concentration of about 1% to about 100%, about 1% to about 10%, about 5% to about 100%, about 25% to about 100%, about 50% to about 100%, about 75% to about 99%, about 2%, about 5%, about 90%, about 95% by weight of the patterning composition.

Metals suitable for use in a patterning composition include, but are not limited to, a transition metal, aluminum, silicon, phosphorous, gallium, germanium, indium, tin, antimony, lead, bismuth, alloys thereof, and combinations thereof.

In some embodiments, the patterning composition comprises a semi-conductive polymer. Semi-conductive polymers suitable for use include, but are not limited to, a polyaniline, a poly(3,4-ethylenedioxythiophene)-poly(styrenesulfonate), a polypyrrole, an arylene vinylene polymer, a polyphenylenevinylene, a polyacetylene, a polythiophene, a polyimidazole, and combinations thereof.

The patterning composition can include an insulating component. As used herein, an "insulating component" refers to a compound or species that is resistant to the movement or transfer of electrical charge. In some embodiments, an insulating component has a dielectric constant of about 1.5 to about 8 about 1.7 to about 5, about 1.8 to about 4, about 1.9 to about 3, about 2 to about 2.7, about 2.1 to about 2.5, about 8 to about 90, about 15 to about 85, about 20 to about 80, about 25 to about 75, or about 30 to about 70. Insulating components suitable for use in the methods disclosed herein include, but are not limited to, a polymer, a metal oxide, a metal carbide, a metal nitride, monomeric precursors thereof, particles thereof, and combinations thereof. Suitable polymers include, but are not limited to, a polydimethylsiloxane, a silsesquioxane, a polyethylene, a polypropylene, a polyimide, and combinations thereof. In some embodiments, for example, an insulating component is present in a concentration of about 1% to about 95%, about 1% to about 80%, about 1% to about 50%, about 1% to about 20%, about 1% to about 10%, about 20% to about 95%, about 20% to about 90%, about 40% to about 80%, about 1%, about 5%, about 10%, about 90%, or about 95% by weight of the patterning composition.

The patterning composition can include a masking component. As used herein, a "masking component" refers to a compound or species that upon reacting forms a surface feature resistant to a species capable of reacting with the surrounding surface. Masking components suitable for use include materials commonly employed in traditional photolithography methods as "resists" (e.g., photoresists, chemical resists, self-assembled monolayers, etc.). Masking components suitable for use in the disclosed methods include, but are not limited to, a polymer such as a polyvinylpyrollidone, poly(epichlorohydrin-co-ethyleneoxide), a polystyrene, a poly(styrene-co-butadiene), a poly(4-vinylpyridine-co-styrene), an amine terminated poly(styrene-co-butadiene), a poly(acrylonitrile-co-butadiene), a styrene-butadiene-styrene block copolymer, a styrene-ethylene-butylene block linear copolymer, a polystyrene-block-poly(ethylene-ran-butylene)-block-polystyrene, a poly(styrene-co-maleic anhydride), a polystyrene-block-poly(ethylene-ran-butylene)-block-polystyrene-graft-maleic anhydride, a polystyrene-block-polyisoprene-block-polystyrene, a polystyrene-block-poly(ethylene-ran-butylene)-block-polystyrene, a polynorbornene, a dicarboxy terminated poly(acrylonitrile-co-butadiene-co-acrylic acid), a dicarboxy terminated poly(acrylonitrile-co-butadiene), a polyethyleneimine, a poly(carbonate urethane), a poly(acrylonitrile-co-butadiene-co-styrene), a poly(vinylchloride), a poly(acrylic acid), a poly(methylmethacrylate), a poly(methyl methacrylate-co-methacrylic acid), a polyisoprene, a poly(1,4-butylene terephthalate), a polypropylene, a poly(vinyl alcohol), a poly(1,4-phenylene sulfide), a polylimonene, a poly(vinylalcohol-co-ethylene), a poly[N,N'-(1,3-phenylene)isophthalamide], a poly(1,4-phenylene ether-ether-sulfone), a poly(ethyleneoxide), a poly[butylene terephthalate-co-poly(alkylene glycol)terephthalate], a poly(ethylene glycol) diacrylate, a poly(4-vinylpyridine), a poly(DL-lactide), a poly(3,3',4,4'-benzophenonetetracarboxylic dianhydride-co-4,4'-oxydianiline/1,3-phenylenediamine), an agarose, a polyvinylidene fluoride homopolymer, a styrene butadiene copolymer, a phenolic resin, a ketone resin, a 4,5-difluoro-2,2-bis(trifluoromethyl)-1,3-dioxane, a salt thereof, and combinations thereof. In some embodiments, a masking component is present in a concentration of about 1% to about 10%, about 1% to about 5%, or about 2% by weight of the patterning composition.

The patterning composition can include a conductive component and a reactive component. For example, a reactive component can promote at least one of: penetration of a conductive component into a surface, reaction between the conductive component and a surface, adhesion between a conductive feature and a surface, promoting electrical contact between a conductive feature and a surface, and combinations thereof. Surface features formed by reacting this patterning composition include conductive features selected from the group consisting of: additive non-penetrating, additive penetrating, subtractive penetrating, and conformal penetrating surface features.

The patterning composition can comprise an etchant and a conductive component, for example, suitable for producing a subtractive surface feature having a conductive feature inset therein.

The patterning composition can comprise an insulating component and a reactive component. For example, a reactive component can promote at least one of: penetration of an insulating component into a surface, reaction between the insulating component and a surface, adhesion between an insulating feature and a surface, promoting electrical contact between an insulating feature and a surface, and combinations thereof. Surface features formed by reacting this patterning composition include insulating features selected from the group consisting of: additive non-penetrating, additive penetrating, subtractive penetrating, and conformal penetrating surface features.

The patterning composition can comprise an etchant and an insulating component, for example, suitable for producing a subtractive surface feature having an insulating feature inset therein.

The patterning composition can comprise a conductive component and a masking component, for example, suitable for producing electrically conductive masking features on a surface.

Other contemplated components of a patterning composition suitable for use with the disclosed methods include thiols, 1,9-nonanedithiol solution, silane, silazanes, alkynes cystamine, N-Fmoc protected amino thiols, biomolecules, DNA, proteins, antibodies, collagen, peptides, biotin, and carbon nanotubes.

For a description of patterning compounds and patterning compositions, and their preparation and use, see Xia and Whitesides, Angew. Chem. Int. Ed., 37, 550-575 (1998) and references cited therein; Bishop et al., Curr. Opinion Colloid & Interface Sci., 1, 127-136 (1996); Calvert, J. Vac. Sci. Technol. B, 11, 2155-2163 (1993); Ulman, Chem. Rev., 96:1533 (1996) (alkanethiols on gold); Dubois et al., Annu. Rev. Phys. Chem., 43:437 (1992) (alkanethiols on gold); Ulman, An Introduction to Ultrathin Organic Films: From Langmuir-Blodgett to Self-Assembly (Academic, Boston, 1991) (alkanethiols on gold); Whitesides, Proceedings of the Robert A. Welch Foundation 39th Conference On Chemical Research Nanophase Chemistry, Houston, Tex., pages 109-121 (1995) (alkanethiols attached to gold); Mucic et al. Chem. Commun. 555-557 (1996) (describes a method of attaching 3' thiol DNA to gold surfaces); U.S. Pat. No. 5,472,881 (binding of oligonucleotide-phosphorothiolates to gold surfaces); Burwell, Chemical Technology, 4, 370-377 (1974) and Matteucci and Caruthers, J. Am. Chem. Soc., 103, 3185-3191 (1981) (binding of oligonucleotides-alkylsiloxanes to silica and glass surfaces); Grabar et al., Anal. Chem., 67, 735-743 (binding of aminoalkylsiloxanes and for similar binding of mercaptoalkylsiloxanes); Nuzzo et al., J. Am. Chem. Soc., 109, 2358 (1987) (disulfides on gold); Allara and Nuzzo, Langmuir, 1, 45 (1985) (carboxylic acids on aluminum); Allara and Tompkins, J. Colloid Interface Sci., 49, 410-421 (1974) (carboxylic acids on copper); Iler, The Chemistry Of Silica, Chapter 6, (Wiley 1979) (carboxylic acids on silica); Timmons and Zisman, J. Phys. Chem., 69, 984-990 (1965) (carboxylic acids on platinum); Soriaga and Hubbard, J. Am. Chem. Soc., 104, 3937 (1982) (aromatic ring compounds on platinum); Hubbard, Acc. Chem. Res., 13, 177 (1980) (sulfolanes, sulfoxides and other functionalized solvents on platinum); Hickman et al., J. Am. Chem. Soc., 111, 7271 (1989) (isonitriles on platinum); Maoz and Sagiv, Langmuir, 3, 1045 (1987) (silanes on silica); Maoz and Sagiv, Langmuir, 3, 1034 (1987) (silanes on silica); Wasserman et al., Langmuir, 5, 1074 (1989) (silanes on silica); Eltekova and Eltekov, Langmuir, 3,951 (1987) (aromatic carboxylic acids, aldehydes, alcohols and methoxy groups on titanium dioxide and silica); and Lec et al., J. Phys. Chem., 92, 2597 (1988) (rigid phosphates on metals); Lo et al., J. Am. Chem. Soc., 118, 11295-11296 (1996) (attachment of pyrroles to superconductors); Chen et al., J. Am. Chem. Soc., 117, 6374-5 (1995) (attachment of amines and thiols to superconductors); Chen et al., Langmuir, 12, 2622-2624 (1996) (attachment of thiols to superconductors); McDevitt et al., U.S. Pat. No. 5,846,909 (attachment of amines and thiols to superconductors); Xu et al., Langmuir, 14, 6505-6511 (1998) (attachment of amines to superconductors); Mirkin et al., Adv. Mater. (Weinheim, Ger.), 9, 167-173 (1997) (attachment of amines to superconductors); Hovis et al., J. Phys. Chem. B, 102, 6873-6879 (1998) (attachment of olefins and dienes to silicon); Hovis et al., Surf. Sci., 402-404, 1-7 (1998) (attachment of olefins and dienes to silicon); Hovis et al., J. Phys. Chem. B, 101, 9581-9585 (1997) (attachment of olefins and dienes to silicon); Hamers et al., J. Phys. Chem. B, 101, 1489-1492 (1997) (attachment of olefins and dienes to silicon); Hamers et al., U.S. Pat. No. 5,908,692 (attachment of olefins and dienes to silicon); Ellison et al., J. Phys. Chem. B, 103, 6243-6251 (1999) (attachment of isothiocyanates to silicon); Ellison et al., J. Phys. Chem. B, 102, 8510-8518 (1998) (attachment of azoalkanes to silicon); Ohno et al., Mol. Cryst. Liq. Cryst. Sci. Technol., Sect. A, 295, 487-490 (1997) (attachment of thiols to GaAs); Reuter et al., Mater. Res. Soc. Symp. Proc., 380, 119-24 (1995) (attachment of thiols to GaAs); Bain, Adv. Mater. (Weinheim, Fed. Repub. Ger.), 4, 591-4 (1992) (attachment of thiols to GaAs); Sheen et al., J. Am. Chem. Soc., 114, 1514-15 (1992) (attachment of thiols to GaAs); Nakagawa et al., Jpn. J. Appl. Phys., Part 1, 30, 3759-62 (1991) (attachment of thiols to GaAs); Lunt et al., J. Appl. Phys., 70, 7449-67 (1991) (attachment of thiols to GaAs); Lunt et al., J. Vac. Sci. Technol., B, 9, 2333-6 (1991) (attachment of thiols to GaAs); Yamamoto et al., Langmuir ACS ASAP, web release number Ia990467r (attachment of thiols to InP); Gu et al., J. Phys. Chem. B, 102, 9015-9028 (1998) (attachment of thiols to InP); Menzel et al., Adv. Mater. (Weinheim, Ger.), 11, 131-134 (1999) (attachment of disulfides to gold); Yonezawa et al., Chem. Mater., 11, 33-35 (1999) (attachment of disulfides to gold); Porter et al., Langmuir, 14, 7378-7386 (1998) (attachment of disulfides to gold); Son et al., J. Phys. Chem., 98, 8488-93 (1994) (attachment of nitriles to gold and silver); Steiner et al., Langmuir, 8, 2771-7 (1992) (attachment of nitriles to gold and copper); Solomun et al., J. Phys. Chem., 95, 10041-9 (1991) (attachment of nitriles to gold); Solomun et al., Ber. Bunsen-Ges. Phys. Chem., 95, 95-8 (1991) (attachment of nitriles to gold); Henderson et al., Inorg. Chim. Acta, 242, 115-24 (1996) (attachment of isonitriles to gold); Huc et al., J. Phys. Chem. B, 103, 10489-10495 (1999) (attachment of isonitriles to gold); Hickman et al., Langmuir, 8, 357-9 (1992) (attachment of isonitriles to platinum); Steiner et al., Langmuir, 8, 90-4 (1992) (attachment of amines and phospines to gold and attachment of amines to copper); Mayya et al., J. Phys. Chem. B, 101, 9790-9793 (1997) (attachment of amines to gold and silver); Chen et al., Langmuir, 15, 1075-1082 (1999) (attachment of carboxylates to gold); Tao, J. Am. Chem. Soc., 115, 4350-4358 (1993) (attachment of carboxylates to copper and silver); Laibinis et al., J. Am. Chem. Soc., 114, 1990-5 (1992) (attachment of thiols to silver and copper); Laibinis et al., Langmuir, 7, 3167-73 (1991) (attachment of thiols to silver); Fenter et al., Langmuir, 7, 2013-16 (1991) (attachment of thiols to silver); Chang et al., Am. Chem. Soc., 116, 6792-805 (1994) (attachment of thiols to silver); Li et al., J. Phys.

Chem., 98, 11751-5 (1994) (attachment of thiols to silver); Li et al., Report, 24 pp (1994) (attachment of thiols to silver); Tarlov et al., U.S. Pat. No. 5,942,397 (attachment of thiols to silver and copper); Waldeck, et al., PCT application WO/99/48682 (attachment of thiols to silver and copper); Gui et al., Langmuir, 7, 955-63 (1991) (attachment of thiols to silver); Walczak et al., J. Am. Chem. Soc., 113, 2370-8 (1991) (attachment of thiols to silver); Sangiorgi et al., Gazz. Chim. Ital., 111, 99-102 (1981) (attachment of amines to copper); Magallon et al., Book of Abstracts, 215th ACS National Meeting, Dallas, Mar. 29-Apr. 2, 1998, COLL-048 (attachment of amines to copper); Patil et al., Langmuir, 14, 2707-2711 (1998) (attachment of amines to silver); Sastry et al., J. Phys. Chem. B, 101, 4954-4958 (1997) (attachment of amines to silver); Bansal et al., J. Phys. Chem. B. 102, 4058-4060 (1998) (attachment of alkyl lithium to silicon); Bansal et al., J. Phys. Chem. B, 102, 1067-1070 (1998) (attachment of alkyl lithium to silicon); Chidsey, Book of Abstracts, 214th ACS National Meeting, Las Vegas, Nev., Sep. 7-11, 1997, I&EC-027 (attachment of alkyl lithium to silicon); Song, J. H., Thesis, University of California at San Diego (1998) (attachment of alkyl lithium to silicon dioxide); Meyer et al., J. Am. Chem. Soc., 110, 4914-18 (1988) (attachment of amines to semiconductors); Brazdil et al. J. Phys. Chem., 85, 1005-14 (1981) (attachment of amines to semiconductors); James et al., Langmuir, 14, 741-744 (1998) (attachment of proteins and peptides to glass); Bernard et al., Langmuir, 14, 2225-2229 (1998) (attachment of proteins to glass, polystyrene, gold, silver and silicon wafers); Pereira et al., J. Mater. Chem., 10, 259 (2000) (attachment of silazanes to $SiO_2$); Pereira et al., J. Mater. Chem., 10, 259 (2000) (attachment of silazanes to $SiO_2$); Dammel, Diazonaphthoquinone Based Resists (1st ed., SHE Optical Engineering Press, Bellingham, Wash., 1993) (attachment of silazanes to $SiO_2$); Anwander et al., J. Phys. Chem. B, 104, 3532 (2000) (attachment of silazanes to $SiO_2$); Slavov et al., J. Phys. Chem., 104, 983 (2000) (attachment of silazanes to $SiO_2$).

Substrates to be Patterned

Substrates suitable for use in methods disclosed herein include, but are not limited to, metals, alloys, composites, crystalline materials, amorphous materials, conductors, semiconductors, optics, fibers, inorganic materials, glasses, ceramics (e.g., metal oxides, metal nitrides, metal silicides, and combinations thereof), zeolites, polymers, plastics, organic materials, minerals, biomaterials, living tissue, bone, films thereof, thin films thereof, laminates thereof, foils thereof, composites thereof, and combinations thereof. A substrate can comprise a semiconductor such as, but not limited to: crystalline silicon, polycrystalline silicon, amorphous silicon, p-doped silicon, n-doped silicon, silicon oxide, silicon germanium, germanium, gallium arsenide, gallium arsenide phosphide, indium tin oxide, and combinations thereof. A substrate can comprise a glass such as, but not limited to, undoped silica glass ($SiO_2$), fluorinated silica glass, borosilicate glass, borophosphorosilicate glass, organosilicate glass, porous organosilicate glass, and combinations thereof. The substrate can be a non-planar substrate, such as pyrolytic carbon, reinforced carbon-carbon composite, a carbon phenolic resin, and the like, and combinations thereof. A substrate can comprise a ceramic such as, but not limited to, silicon carbide, hydrogenated silicon carbide, silicon nitride, silicon carbonitride, silicon oxynitride, silicon oxycarbide, high-temperature reusable surface insulation, fibrous refractory composite insulation tiles, toughened unipiece fibrous insulation, low-temperature reusable surface insulation, advanced reusable surface insulation, and combinations thereof. A substrate can comprise a flexible material, such as, but not limited to: a plastic, a metal, a composite thereof, a laminate thereof, a thin film thereof, a foil thereof, and combinations thereof. See International Patent Publication No. WO 2009/132321 and see International Patent Application No. PCT/US2010/024631, the entire disclosures of which are incorporated herein by reference for a description of examples of suitable substrates for use with Polymer Pen Lithography and Gel Pen Lithography, respectively.

The surfaces to pattern by BPL can include any suitable substrate, and preferably one which can be advantageously affected by exposure to radiation. See International Patent Application No. PCT/US2010/024633, the entire disclosure of which is incorporated herein by reference. For example, the substrate can be photosensitive or can include a photosensitive layer. For example, the photosensitive substrate or photosensitive layer can be a resist layer. The resist layer can be any known resist material, for example SHIPLEY1805 (MicroChem Inc.). Other suitable resist materials include, but are not limited to, Shipley1813 (MicroChem Inc.), Shipley1830 (MicroChem Inc.), PHOTORESIST AZ1518 (MicroChemicals, Germany), PHOTORESIST AZ5214 (MicroChemicals, Germany), SU-8, and combinations thereof. Other examples of photosensitive materials include, but are not limited to, liquid crystals and metals. For examples, the substrate can include metal salts that can be reduced when exposed to the radiation. Substrates suitable for use in methods disclosed herein include, but are not limited to, metals, alloys, composites, crystalline materials, amorphous materials, conductors, semiconductors, optics, fibers, inorganic materials, glasses, ceramics (e.g., metal oxides, metal nitrides, metal silicides, and combinations thereof), zeolites, polymers, plastics, organic materials, minerals, biomaterials, living tissue, bone, and laminates and combinations thereof. The substrate can be in the form of films, thin films, foils, and combinations thereof. A substrate can comprise a semiconductor including, but not limited to one or more of: crystalline silicon, polycrystalline silicon, amorphous silicon, p-doped silicon, n-doped silicon, silicon oxide, silicon germanium, germanium, gallium arsenide, gallium arsenide phosphide, indium tin oxide, graphene, and combinations thereof. A substrate can comprise a glass including, but not limited to, one or more of undoped silica glass ($SiO_2$), fluorinated silica glass, borosilicate glass, borophosphorosilicate glass, organosilicate glass, porous organosilicate glass, and combinations thereof. The substrate can be a non-planar substrate, including, but not limited to, one or more of pyrolytic carbon, reinforced carbon-carbon composite, a carbon phenolic resin, and combinations thereof. A substrate can comprise a ceramic including, but not limited to, one or more of silicon carbide, hydrogenated silicon carbide, silicon nitride, silicon carbonitride, silicon oxynitride, silicon oxycarbide, high-temperature reusable surface insulation, fibrous refractory composite insulation tiles, toughened unipiece fibrous insulation, low-temperature reusable surface insulation, advanced reusable surface insulation, and combinations thereof. A substrate can comprise a flexible material, including, but not limited to one or more of: a plastic, a metal, a composite thereof, a laminate thereof, a thin film thereof, a foil thereof, and combinations thereof.

The photosensitive substrate or the photosensitive layer can have any suitable thickness, for example in a range of about 100 nm to about 5000 nm. For example, the minimum photosensitive substrate or photosensitive layer thickness can be about 100, 150, 200, 250, 300, 350, 400, 450 or 500, 550, 600, 650, 700, 750, 800, 850, 900, 950, 1000, 1500, 2000, 2500, 3000, 3500, 4000, 4500, or 5000 nm. For example, the maximum photosensitive substrate or photosensitive layer thickness can be about 100, 150, 200, 250, 300, 350, 400, 450 or 500, 550, 600, 650, 700, 750, 800, 850, 900, 950, 1000, 1500, 2000, 2500, 3000, 3500, 4000, 4500, or 5000 nm. The diameter of the indicia formed by the pen array can be modulated by modifying the resist material used and/or the thickness of the photosensitive substrate or photosensitive layer. For example, under the same radiation conditions, a thicker photosensitive layer can result in indicia having larger diameters. At constant photosensitive layer thickness, an increase in radiation intensity can results in indicia having larger diameters.

Applications for Combinatorial Arrays

Deliberately, controllably tilting a polymer pen array to produce combinatorial arrays of feature sizes on a substrate has a variety of applications including, for example, patterning of biomolecules and inorganic materials. For example, combinatorial arrays of metal nanoparticles can be printed using the method in accordance with an embodiment of the disclosure to examine the effect of nanoparticle size on catalysis. Combinatorial arrays produced by a method in accordance with an embodiment of the disclosure also have use in biological applications. For example, such combinatorial arrays can be used to study the size effects on biological processes, such as for example, in monitoring the growth and differentiation of stem cells on patterns with different feature sizes. The combinatorial arrays formed by a method in accordance with an embodiment of the disclosure can also be used to examine the effects of geometry on cell adhesion.

Additional aspects and details of the disclosure will be apparent from the following examples, which are intended to be illustrative rather than limiting.

EXAMPLES

Example 1

Patterning of Gold Nanoparticles

Figure 5A:
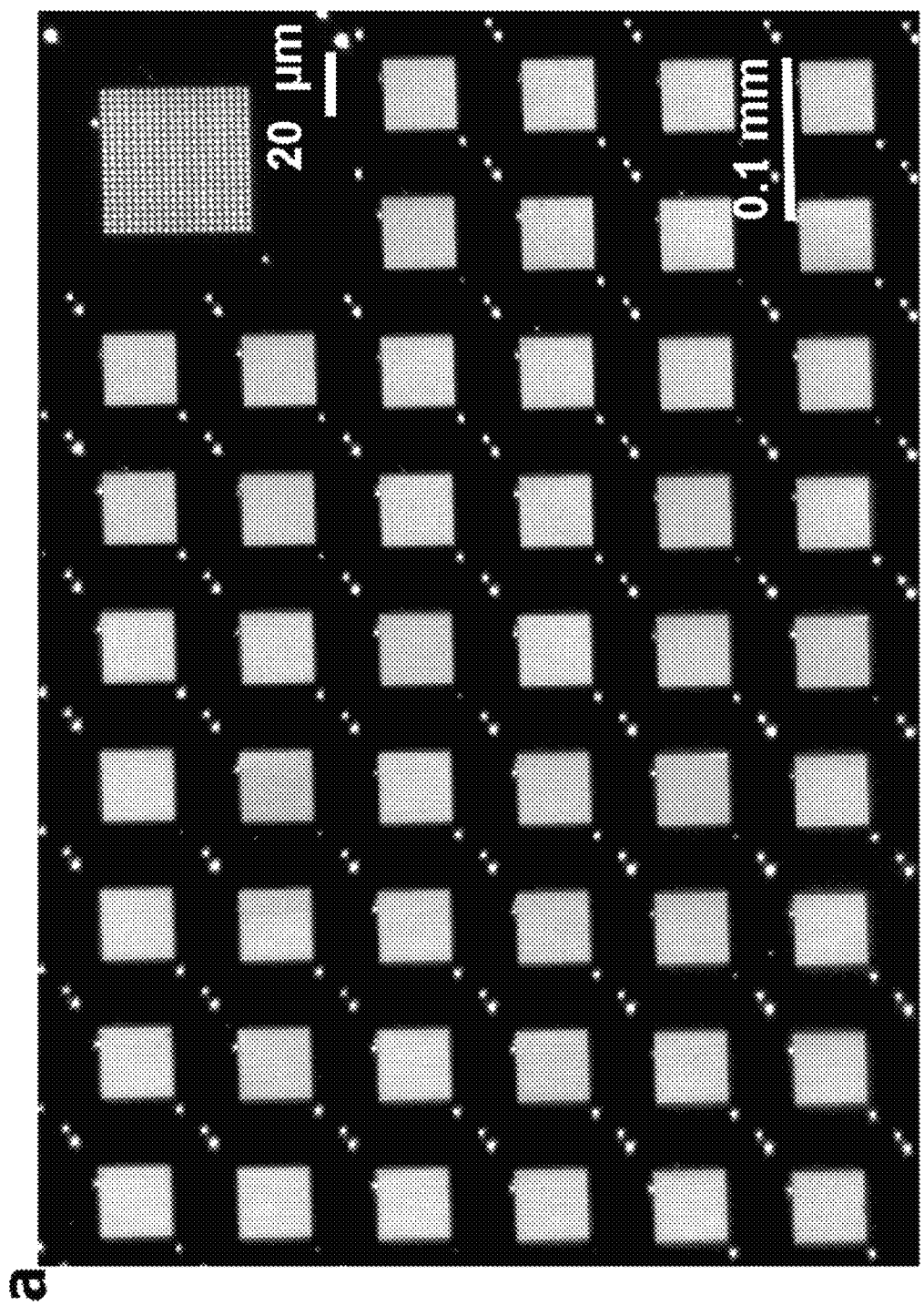
FIG. 5a is a scanning electron microscopy image of several arrays of gold nanoparticles printed in accordance with an embodiment of the method of the present disclosure, the inset shows a single array.
Figure 5B:
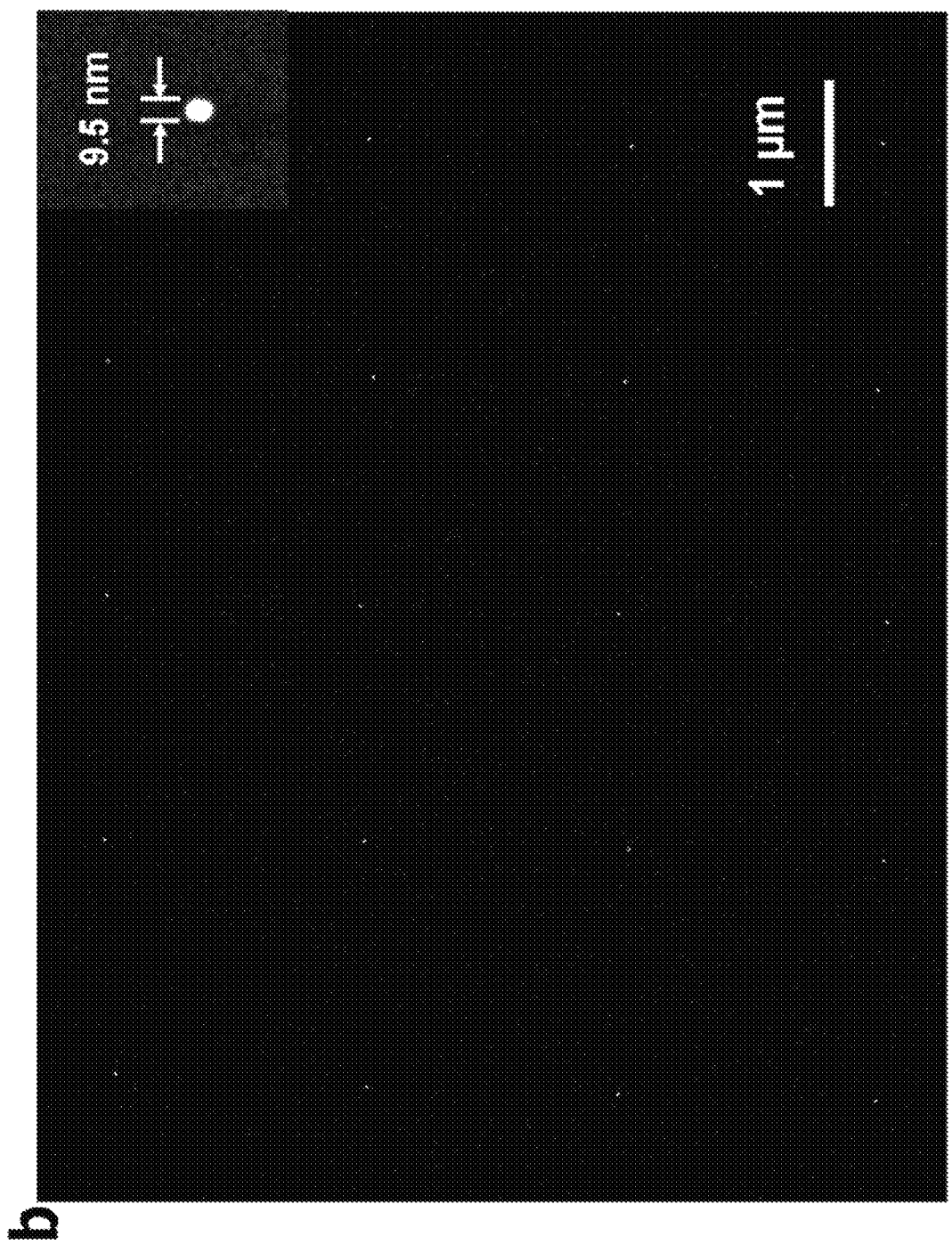
FIG. 5b is a scanning electron microscopy image of one portion of an array of FIG. 5a, the inset shows the size of a single gold nanoparticle.

Combinatorial arrays of metal nanoparticles were generated in order to examine the effect of the nanoparticle size on catalysis. A precursor metal salt, $AuCl_3$, was dissolved in a patterning solution that consisted of about 0.5 wt. % poly(ethyleneoxide)-b-poly(2-vinylpyridine) dissolved in water. A polymer pen array was coated with the patterning solution. The polymer pen array was leveled and then intentionally, controllably tilted relative to the leveled position in one angle and used to print an array of dots with varying feature size on the substrate surface. The polymer/metal salt/water features were then annealed under plasma (for example, oxygen or argon), which simultaneously cleaned the polymer off the substrate and reduced the metal ions, yielding single-cystalline nanoparticles. FIGS. 5a and 5b illustrate the arrays of gold nanoparticles printed on the surface.

The single crystal nanoparticles can then be used to catalyze reactions whose rate may be related to the size of the catalytic nanoparticle. Referring to FIG. 6, because of the size of the nanoparticles in each array varies down a column, this can allow for a quick screen for the nanoparticle size that exhibits highest catalytic activity. For example, such screening can be done by employing infrared thermography, a technique well known in the art for use in combinatorial catalyst screening. See Moates et al., 35 Ind. Eng. Chem. Res. 4801-03 (1996); Holzwarth et al., 37 Angew. Chem. Int. Ed. 2644-47 (1998); Taylor et al., 280 Science 267-70 (1998); and Bell, 299 Science 1688-91 (2003). Since most reactions have a measurable enthalpy of reaction $\Delta H_{rxn}$, the most active catalyst will appear as a hot (or cold, depending on the sign of $\Delta H_{rxn}$) spot in an infrared thermograph. See Holzwarth et al., 37 Angew. Chem. Int. Ed. 2644-47 (1998). This technique is quite general and requires relatively simple equipment. Additionally, while each nanoparticle may be too small to image directly with an infrared camera, each array, which consists of a large number of identical particles, is large enough to be imaged. It can be inferred that the most active array contains the most active nanoparticles.

Since this printing technique is generally applicable for a variety of metal nanoparticles, this combinatorial synthesis and screening approach can be applied to many different catalytic systems and a variety of screening approaches, such as µGC, GC/MS, and scanning electrochemical microscopy. For a description of these other characterization techniques see, for example, Maier et al., 46 Angew. Chem. Int. Ed. 6016-67 (2007); Farrusseng 63 Surf. Sci. Rep. 487-513 (2008); and Corma et al., 107-108 Catal. Today 3-11 (2005). For example, this printing technique combined with a known screening method can be used to analyze the oxidation of carbon monoxide by gold nanoparticles, the reduction of unsaturated hydrocarbons by platinum and palladium, and the reduction of oxygen by platinum. While the nanoparticle size effects on catalytic activity have been characterized for many of these systems (see e.g., Koper Fuel Cell Catalysis: A surface Science Approach (John Wiley & Sons, NJ 2009); and Valden et al., 281 Science 1647-1650 (1998)), the method in accordance with an embodiment of the present disclosure allows such screening to be done using a combinatorial approach on a single substrate. Additionally, because of the general applicability of the printing technique and the characterization technique, this method can be applied to virtually any nanoparticle-catalyzed reaction.

Example 2

Studying Size Effects on Biological Processes

Figure 8A:
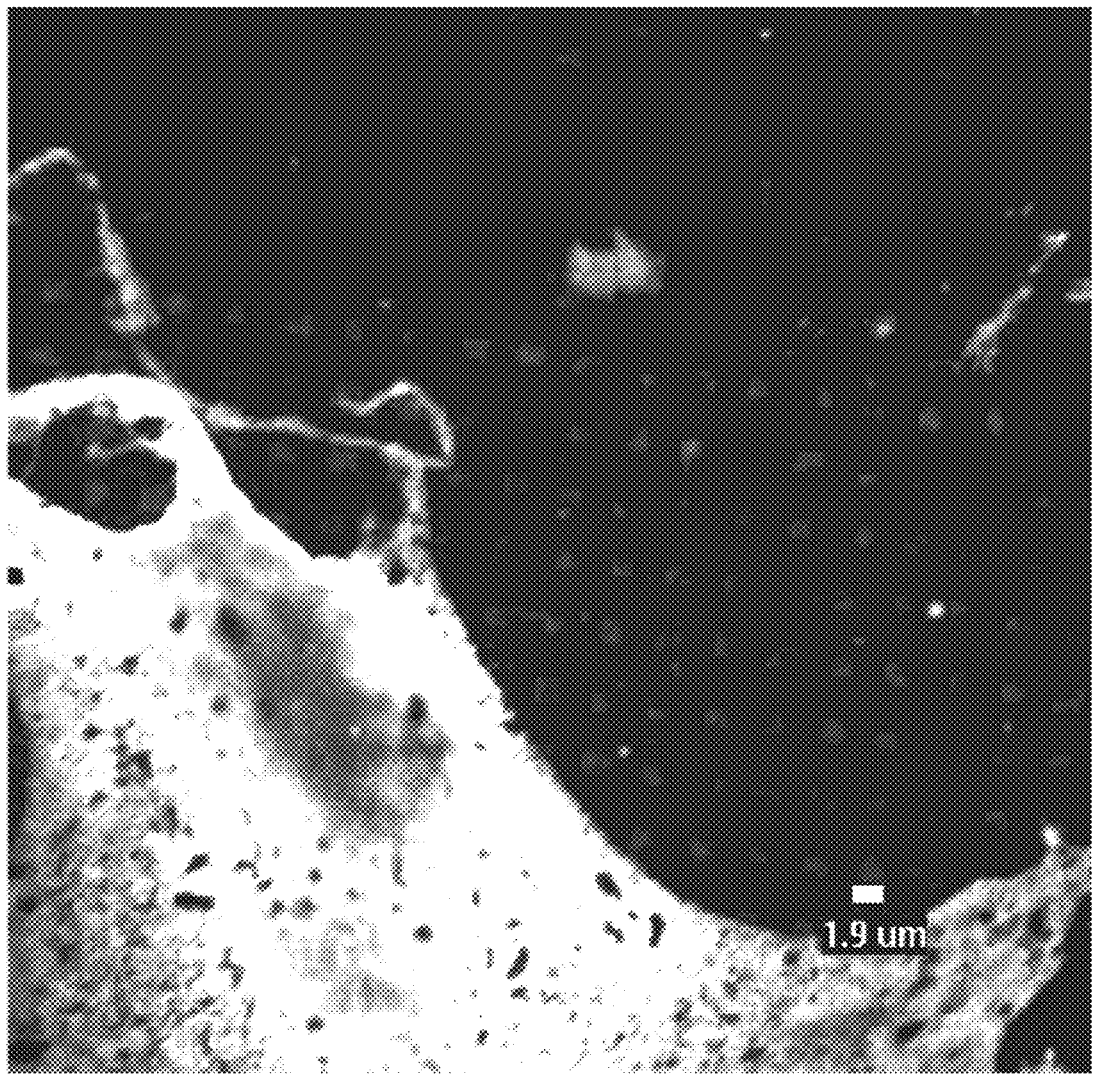
FIG. 8A is a fluorescence microscopy image of a stem cell grown on a surface displaying a combinatorial pattern of different sized features of fibronectin.
Figure 8B:
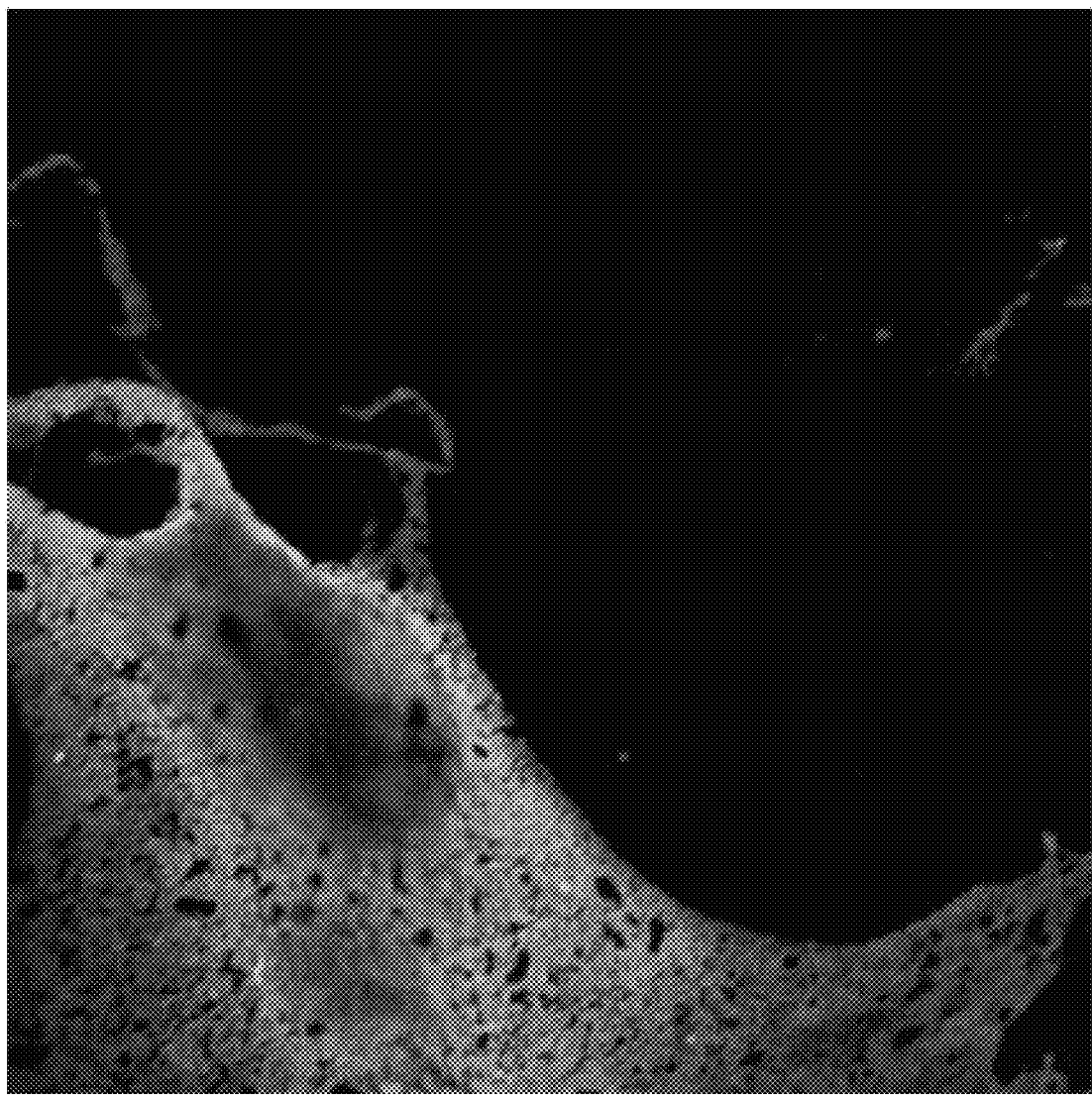
FIG. 8B is a fluorescence microscopy image of the stem cell of FIG. 8A.
Figure 8C:
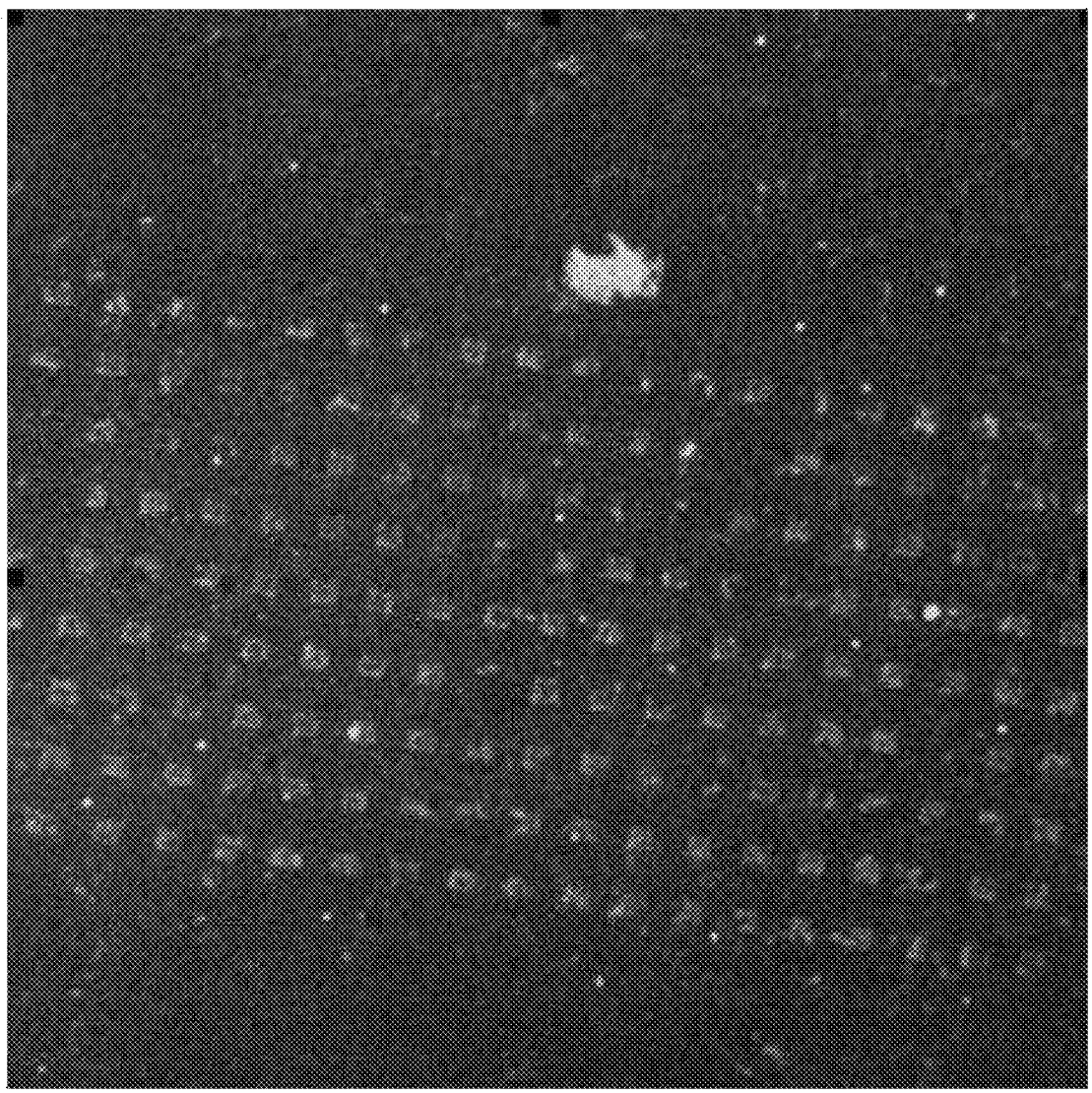
FIG. 8C is a fluorescence microscopy image of the combinatorial pattern of different sized features of fibronectin of FIG. 8A.

Deposition of patterns having varying feature sizes can also be useful in studying the effects of size on biological processes. The growth and differentiation of stem cells on patterns with different feature sizes was examined. It has been shown the both micropatterned substrates and substrates of varying stiffness can be used to drive differentiation in multipotent mesenchymal stem cells (MSCs). See Engler et al., 126 Cell 677-89 (2006) and McBeath et al., 6 Dev. Cell 483-95 (2004). Thus, varying the feature size of nanopatterns on a substrate can have an effect on stem cell differentiation. Size-varying combinatorial nanopatterns of the extracellular matrix (ECM) protein fibronectin were written with a tilted pen array to intentionally create a gradient of feature sizes for facile combinatorial screening to determine the feature size that optimally drives stem cell differentiation. The tilted array was used to print patterns of small molecules that bind to an ECM protein (i.e., fibronectin), which subsequently interacted with a cell's focal adhesion complexes, which enable stem cells to adhere to the surface of the combinatorial array, as shown in FIG. 8A. FIGS. 8B and 8C show the stem cell and the combinatorial array of FIG. 8A, respectively. The differentiation of stem cells into various lineages is subsequently tracked with immunofluorescent staining specific to the stem cell lineage in question, for example, osteoblasts. See Schieker et al., 210 J. Anat. 592-99 (2007).

Example 3

Studying Geometry Effects on Biological Processes

Figure 9:
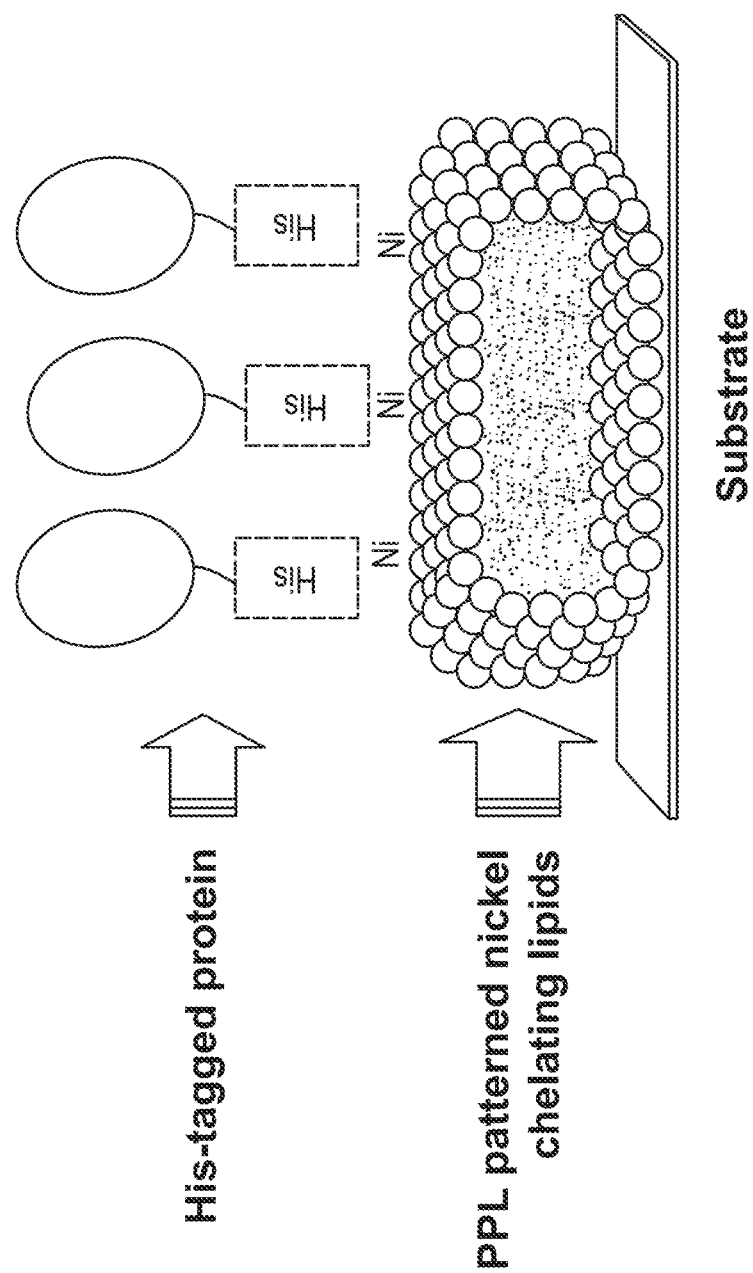
FIG. 9 is a schematic drawing of a patterned biomimetic membrane bearing nickel chelating groups that adsorb His-tagged adhesion protein, such as cadherin. The lipid bilayer membrane containing nickel chelating moieties is patterned by PPL, which can subsequently be used to capture His-tagged proteins.

Patterns generated by deliberately, controllably tilted pen arrays can also be used in the investigation of geometric effects on cell adhesion. It has been shown that cadherin mediates several important cell processes, including apoptosis, cell differentiation, cell movement, and tissue organization. See Kusumi et al., 11 Curr. Opin. Cell. Biol. 582-90 (1999); van Roy et al., 66 Cell Mol. Life. Sci. 3756-3788 (2008); Anastasiadis et al., 113 Cell Sci. 1319-1334 (2000); and Leckband et al., 8 Annu. Rev. Biol. Eng. 259-87 (2006). It is difficult to study these systems in vitro, however, as they require biomimetic lipid membranes with tethered adhesion proteins. This problem can be addressed using the pen arrays and methods described herein to construct biomimetic membranes that serve as an adsorbing surface for His-tagged cadherin. Referring to FIG. 9, this approach creates a lipid raft where the cadherin can freely diffuse within the pattern, but cannot exceed the boundaries of the printed pattern.

The deliberately, controllably tilted pen array can be used to print lipid features with varying sizes across an array, allowing a facile investigation of the effect that density and proximity of cadherins have on activating cellular adhesion and signaling. Staining for Rac1, p120, cadherin, actin, and catenin would allow visualization of cellular adhesion across the array. Rac1 and p120 have been associated with E-cadherin activation. See Liu et al., 173, J. Cell Bio. 431-41 (2006).

The foregoing describes and exemplifies aspects of the invention, but is not intended to limit the invention defined by the claims which follow. All of the methods disclosed and claimed herein can be made and executed without undue experimentation in light of the present disclosure. While the materials and methods of this invention have been described in terms of specific embodiments, it will be apparent to those of skill in the art that variations may be applied to the materials and/or methods and in the steps or in the sequence of steps of the methods described herein without departing from the concept, spirit and scope of the invention. More specifically, it will be apparent that certain agents which are both chemically and physiologically related may be substituted for the agents described herein while the same or similar results would be achieved.

All patents, publications and references cited herein are hereby fully incorporated by reference. In case of conflict between the present disclosure and incorporated patents, publications and references, the present disclosure should control.

What is claimed:

1. A method of forming a pattern comprising pattern elements with a plurality of sizes on a substrate surface with a tilted pen array, comprising:
choosing a tilt geometry for a pen array with respect to a substrate surface,
the tilt geometry being in reference to a substrate surface and comprising a first angle of the pen array with respect to a first axis of the substrate and a second angle of the pen array with respect to a second axis of the substrate, the first and second axes being parallel to the substrate surface and perpendicular to one another, at least one of the first and second angles being non-zero, wherein a leveled position with respect to the substrate surface comprises first and second angles both equaling 0°, and
the pen array comprising a plurality of tips fixed to a common substrate layer, the plurality of tips and the common substrate layer being formed from an elastomeric polymer or elastomeric gel polymer, and the tips having a radius of curvature of less than 1 µm;
inducing the tilt geometry between the pen array and the substrate surface by the chosen first and second angles; and
forming a pattern having pattern elements on the substrate surface with the titled pen array, whereby the size of the formed pattern elements varies across the substrate surface along the tilted axis or axes.

2. A method of forming a pattern comprising pattern elements with a plurality of sizes on a substrate surface with a tilted pen array, comprising:
choosing a range of pattern element sizes for a pattern to be formed on a substrate surface;
choosing, based on a theoretical model, a tilt geometry for a pen array with respect to the substrate surface to achieve the chosen range of pattern element sizes,
the tilt geometry being in reference to a substrate surface and comprising a first angle of the pen array with respect to a first axis of the substrate and a second angle of the pen array with respect to a second axis of the substrate, the first and second axes being parallel to the substrate surface and perpendicular to one another, at least one of the first and second angles being non-zero, wherein a leveled position with respect to the substrate surface comprises first and second angles both equaling 0°, and
the pen array comprising a plurality of tips fixed to a common substrate layer, the plurality of tips and the common substrate layer being formed from an elastomeric polymer or elastomeric gel polymer, and the tips having a radius of curvature of less than 1 µm;
inducing the tilt geometry between the pen array and the substrate surface by the chosen first and second angles; and
forming the pattern having pattern elements on the substrate surface with the titled pen array, whereby the size of the formed pattern elements varies across the substrate surface along the tilted axis or axes and comprises the chosen range of pattern element sizes.

3. The method of claim 2, wherein the theoretical model predicts a pattern element size generated by each tip based a combination of the first and second angles, a spacing between tips of the tip array, an edge length of a top surface of the tip, an edge length at a bottom surface of the tip, a height of the tip, a compression modulus of the elastomeric polymer, a number of tips from a first tip to contact the substrate surface the tip is spaced in the first axis, and a number of tips from a first tip to contact the substrate surface the tip is spaced in the second axis.

4. The method of claim 1, comprising inducing the tilt geometry between the pen array and the substrate surface by tilting the pen array and maintaining the substrate surface stationary.

5. The method of claim 4, comprising tilting the pen array by providing a motor-controlled, multi-axis stage attached to the pen array, and controlling the degree of extension of one or more motors to induce the desired tilt angles.

6. The method of claim 1, further comprising coating the pen array with a patterning composition, wherein forming the pattern comprises contacting the substrate surface with the tilted pen array to deposit the patterning composition onto the substrate surface.

7. The method of claim 6, comprising contacting the substrate surface with the tilted pen array such that all of the plurality of tips of the pen array contact the substrate surface and deform, whereby deformation of the plurality of tips varies across the pen array along the tilted axis or axes.

8. The method of claim 6, wherein the patterning composition comprises a biomaterial having an activity, and further comprising selecting a patterning composition formulation to preserve the activity of the biomaterial when depositing the patterning composition onto the substrate surface.

9. The method of claim 6, wherein the patterning composition is free of exogenous patterning composition carriers.

10. The method of claim 6, wherein coating the pen array with a patterning composition comprises adsorbing and/or absorbing the patterning composition onto the tip array.

11. The method of claim 6, wherein the patterning composition is a metal nanoparticle-forming patterning composition, and the pattern is an array of nanoparticles, the method further comprising catalyzing a reaction using the array of nanoparticles; and analyzing the array of nanoparticles to determine a nanoparticle size which exhibits the highest catalytic activity.

12. The method of claim 11, wherein the metal nanoparticle-forming patterning composition comprises a metal nanoparticle precursor material or pre-formed metal nanoparticles.

13. The method claim 1, wherein said forming comprises irradiating at least one tip of the pen array with a radiation source to transmit radiation through the at least one tip and out a tip end disposed opposite the common substrate layer; and exposing a portion of the substrate surface with the transmitted radiation.

14. The method of claim 1, wherein the pattern elements have a dot size or line width of less than 900 nm.

15. The method of claim 1, wherein the pattern elements have a dot size or line width of less than 100 nm.

16. The method of claim 1, comprising inducing a tilt geometry comprising either or both of the first and second angles in a range of −20° to 20°.

17. The method of claim 1, comprising inducing a tilt geometry comprising either or both of the first and second angles in a range of −6° to 6°.

18. The method of claim 1, comprising inducing a tilt geometry comprising both the first and second angles as non-zero values.

19. The method of claim 1, comprising choosing one of the first and second angles to be 0°.

20. The method of claim 1, wherein the size of the pattern elements differs by a value in a range of about 10 nm to about 100 μm.

21. The method of claim 1, wherein adjacent tips of the pen array have a tip-to-tip spacing and thereby forming a spacing between adjacent pattern elements substantially equal to the tip-to-tip spacing between adjacent tips of the pen array.

22. The method of claim 1, wherein the plurality of tips are pyramidal.

23. The method of claim 1, wherein the plurality of tips are arranged in a regular periodic pattern.

24. The method of claim 1 comprising leveling the pen array to the leveled position with respect to the substrate surface prior to inducing the tilt geometry.

* * * * *